US008494830B2

(12) United States Patent
Radibratovic et al.

(10) Patent No.: US 8,494,830 B2
(45) Date of Patent: Jul. 23, 2013

(54) METHOD FOR PREDICTING SYMMETRIC, AUTOMATED, REAL-TIME ARC FLASH ENERGY WITHIN A REAL-TIME MONITORING SYSTEM

(75) Inventors: Branislav Radibratovic, San Diego, CA (US); Kevin Meagher, Raleigh, NC (US)

(73) Assignee: Power Analytics Corporation, San Diego, CA (US)

( * ) Notice: Subject to any disclaimer, the term of this patent is extended or adjusted under 35 U.S.C. 154(b) by 934 days.

(21) Appl. No.: 12/506,216

(22) Filed: Jul. 20, 2009

(65) Prior Publication Data

US 2010/0023309 A1 Jan. 28, 2010

Related U.S. Application Data

(60) Provisional application No. 61/082,044, filed on Jul. 18, 2008.

(51) Int. Cl.
*G06G 7/54* (2006.01)
(52) U.S. Cl.
USPC .......................................................... 703/18
(58) Field of Classification Search
CPC ................................................. G06F 2217/78
USPC ..................................... 703/13, 18; 714/741
See application file for complete search history.

(56) References Cited

U.S. PATENT DOCUMENTS

| 2,309,934 | A  | 2/1943  | Clay          |
|-----------|----|---------|---------------|
| 6,002,260 | A  | 12/1999 | Lau et al.    |
| 6,597,999 | B1 | 7/2003  | Sinha et al.  |
| 6,633,474 | B1 | 10/2003 | Boudaud       |
| 7,200,502 | B2 | 4/2007  | Gasperi et al. |
| 2003/0065486 | A1* | 4/2003 | Sumida et al. ................ 702/189 |
| 2003/0205938 | A1 | 11/2003 | Andarawis et al. |
| 2005/0023996 | A1 | 2/2005 | Adamson et al. |
| 2005/0033481 | A1 | 2/2005 | Budhraja et al. |

(Continued)

FOREIGN PATENT DOCUMENTS

| JP | 200724511 A1 | 2/2007 |
| WO | 2008011563 A2 | 1/2008 |

OTHER PUBLICATIONS

Christipher Inshaw, "ARC Flash Hazard Analysis and Mitigation", Western Protective Relay Conference, Oct. 2004.*

(Continued)

*Primary Examiner* — Kamini S Shah
*Assistant Examiner* — Luke Osborne
(74) *Attorney, Agent, or Firm* — Procopio, Cory, Hargreaves & Savitch LLP; Noel C. Gillespie

(57) ABSTRACT

A system for making real-time predictions about an arc flash event on an electrical system comprises a data acquisition component communicatively connected to a sensor configured to acquire real-time data output from the electrical system; an analytics server communicatively connected to the data acquisition component and comprising a virtual system modeling engine configured to generate predicted data output for the electrical system using a virtual system model of the electrical system, an analytics engine configured to monitor the real-time data output and the predicted data output of the electrical system, and an arc flash simulation engine configured to use the virtual system model updated based in the real-time data to forecast an aspect of the arc flash event.

19 Claims, 17 Drawing Sheets

U.S. PATENT DOCUMENTS

2005/0043922 A1    2/2005  Weidl
2006/0126608 A1*   6/2006  Pereira et al. ................ 370/360
2008/0004853 A1    1/2008  Radibratovic et al.
2008/0141072 A1    6/2008  Kalgren et al.

OTHER PUBLICATIONS

International Search Report and Written Opinion related to PCT/US07/62153 mailed Feb. 12, 2008, 12 pages.

International Search Report and Written Opinion related to PCT/US07/06195 mailed Feb. 22, 2008, 15 pages.

Merrell, John, "The Importance of the X/R Ratio in Low-Voltage Short Circuit Studies," Nov. 17, 1999. <URL: http:www.powerstudies.com/articles/ImportanceofX-over-RRatios.pdf? entire document, especially pp. 3-6.

Gammon, et al. "Incident Energy Factors and Simple 480-V Incident Energy Equations," IEEE 1584-2002, IEEE Industry Applications Magazine, vol. 11, pp. 23-31, Feb. 17, 2005.

International Search Report for PCT/US07/72539 mailed Jul. 29, 2008, 6 pages.

Catcher 13.85% Arcing Current, ArcFlashForum—forum thread [online] Jul. 24, 2007 [retrieved Dec. 2, 2008]. <URL: http://www.arcflashforum.com/showthread.php?t=15>, 2 pages.

International Search Report of PCT/US2008/079601, Mailed Dec. 10, 2008, 11 pages.

Shokooh, et al. "Real-Time Simulation and Supervisory Control: The Next Logical Step After System Monitoring," PCIC-96-32 (1996), 1 page.

A. Marroquin, "Evaluating the Hazards of Low-Voltage Arcs," Electrical Products & Solutions, Jun. 2007. 4 pages.

"Entellisys Low-Voltage Switchgear," GE Consumer and Industrial Electrical Distribution, 2005, 17 pages.

"Arc-resistant Motor Control Equipment Increases Safety and Reduces PPE Requirements," Rockwell Automation, Apr. 2007, 4 pages.

Extended Search Report issued by the European Patent Office in related European Application No. 09798861.2 dated Feb. 1, 2012 (5 pages).

International Search Report and Written Opinion related to PCT/US2009/051189 mailed Mar. 2, 2010.

* cited by examiner

METHOD FOR PREDICTING SYMMETRIC, AUTOMATED, REAL-TIME ARC FLASH ENERGY WITHIN A REAL-TIME MONITORING SYSTEM

RELATED APPLICATION INFORMATION

This application claims the benefit under 35 U.S.C. §119 (e) of U.S. Provisional Application Ser. No. 61/082,044, filed Jul. 18, 2008 and entitled "Symmetric, Automated Real-Time Arc Flash," and which is incorporated herein by reference in its entirety as if set forth in full.

This application is also related to U.S. patent application Ser. No. 11/771,861, filed Jun. 29, 2007 and entitled "Systems and Methods for Providing A Real-Time Predictions of Arc Flash Incident Energy, Arc Flash Protection Boundary, and Required Personal Protective Equipment (PPE) Levels to Comply with Workplace Safety Standards," and to U.S. patent application Ser. No. 12/249,698, filed Oct. 10, 2008 and entitled "A Method for Predicting Arc Flash Energy and PPE Category within a Real-Time Monitoring System." The disclosures of the above-identified applications are incorporated herein by reference as if set forth in full.

BACKGROUND

I. Technical Field

The present invention relates generally to computer modeling and management of systems and, more particularly, to computer simulation techniques with real-time system monitoring and prediction of electrical system performance.

II. Background

Computer models of complex systems enable improved system design, development, and implementation through techniques for off-line simulation of the system operation. That is, system models can be created that computers can "operate" in a virtual environment to determine design parameters. All manner of systems can be modeled, designed, and virtually operated in this way, including machinery, factories, electrical power and distribution systems, processing plants, devices, chemical processes, biological systems, and the like. Such simulation techniques have resulted in reduced development costs and superior operation.

Design and production processes have benefited greatly from such computer simulation techniques, and such techniques are relatively well developed, but such techniques have not been applied in real-time, e.g., for real-time operational monitoring and management. In addition, predictive failure analysis techniques do not generally use real-time data that reflect actual system operation. Greater efforts at real-time operational monitoring and management would provide more accurate and timely suggestions for operational decisions, and such techniques applied to failure analysis would provide improved predictions of system problems before they occur. With such improved techniques, operational costs could be greatly reduced.

For example, mission critical electrical systems, e.g., for data centers or nuclear power facilities, must be designed to ensure that power is always available. Thus, the systems must be as failure proof as possible, and many layers of redundancy must be designed in to ensure that there is always a backup in case of a failure. It will be understood that such systems are highly complex, a complexity made even greater as a result of the required redundancy. Computer design and modeling programs allow for the design of such systems by allowing a designer to model the system and simulate its operation. Thus, the designer can ensure that the system will operate as intended before the facility is constructed.

Once the facility is constructed, however, the design is typically only referred to when there is a failure. In other words, once there is failure, the system design is used to trace the failure and take corrective action; however, because such design are complex, and there are many interdependencies, it can be extremely difficult and time consuming to track the failure and all its dependencies and then take corrective action that does not result in other system disturbances.

Moreover, changing or upgrading the system can similarly be time consuming and expensive, requiring an expert to model the potential change, e.g., using the design and modeling program. Unfortunately, system interdependencies can be difficult to simulate, making even minor changes risky.

Conventional static Arc Flash simulation systems use a rigid simulation model that does not take the actual power system alignment and aging effects into consideration when computing predictions about the operational performance of an electrical system. These systems rely on exhaustive studies to be performed off-line by a power system engineer who must manually modify a simulation model so that it is reflective of the proposed facility operation conditions before conducting the static simulation or the series of static simulations. Therefore, they cannot readily adjust to the many daily changes to the electrical system that occur at a facility, e.g., motors and pumps may be put on-line or pulled off-line, utility electrical feeds may have changed, etc., nor accurately predict the various aspects, i.e., the quantity of energy released, the required level of worker PPE, the safe protection boundaries around components of the electrical system, etc., related to an Arc Flash event occurring on the electrical system.

Moreover, real-time Arc Flash simulations are typically performed by manually modifying the simulation model of the electrical power system such that the automatic transfer switch (ATS) of the bypass branch of the uninterrupted power supply (UPS) component is set to a bypass position. After, Arc Flash analyses and/or simulations are performed using the modified simulation model. One challenge with this approach is that while the Arc Flash analysis and/or simulation is being performed, the simulation model is not identical to the system being modeled. The Arc Flash analysis typically lasts for several seconds. If during that time another analysis (e.g., power flow, etc.) needs to be performed, the simulation model will not be indicative of the true state of the electrical power system (as it will have the ATS set to a bypass position), resulting in misleading data to be generated from the analyses and/or simulations performed using the modified simulation model.

SUMMARY

Methods for making real-time predictions about an Arc Flash event on an electrical system are disclosed.

In one aspect, a system for making real-time predictions about an arc flash event on an electrical system comprises a data acquisition component communicatively connected to a sensor configured to acquire real-time data output from the electrical system; an analytics server communicatively connected to the data acquisition component and comprising a virtual system modeling engine configured to generate predicted data output for the electrical system using a virtual system model of the electrical system, an analytics engine configured to monitor the real-time data output and the predicted data output of the electrical system, and an arc flash simulation engine configured to use the virtual system model updated based in the real-time data to forecast an aspect of the arc flash event.

These and other features, aspects, and embodiments of the invention are described below in the section entitled "Detailed Description."

BRIEF DESCRIPTION OF THE DRAWINGS

For a more complete understanding of the principles disclosed herein, and the advantages thereof, reference is now made to the following descriptions taken in conjunction with the accompanying drawings, in which.

DETAILED DESCRIPTION systems and methods for providing real-time predictions of Arch Flash incident energy, Arch Flash protection boundary, and required personal protective equipment (PPE) to comply with workplace safety standards are disclosed. It will be clear, however, that the systems and methods described herein are to be practiced without some or all of these specific details. In other instances, well known process operations have not been described in detail in order not to unnecessarily obscure the systems and methods described herein.

As used herein, a system denotes a set of components, real or abstract, comprising a whole where each component interacts with or is related to at least one other component within the whole. Examples of systems include machinery, factories, electrical systems, processing plants, devices, chemical processes, biological systems, data centers, aircraft carriers, and the like. An electrical system can designate a power generation and/or distribution system that is widely dispersed, i.e., power generation, transformers, and/or electrical distribution components distributed geographically throughout a large region, or bounded within a particular location, e.g., a power plant within a production facility, a bounded geographic area, on board a ship, etc.

A network application is any application that is stored on an application server connected to a network, e.g., local area network, wide area network, etc., in accordance with any contemporary client/server architecture model and can be accessed via the network. In this arrangement, the network application programming interface (API) resides on the application server separate from the client machine. The client interface would typically be a web browser, e.g. INTERNET EXPLORER™, FIREFOX™, NETSCAPE™, etc., that is in communication with the network application server via a network connection, e.g., HTTP, HTTPS, RSS, etc.

Figure 1:
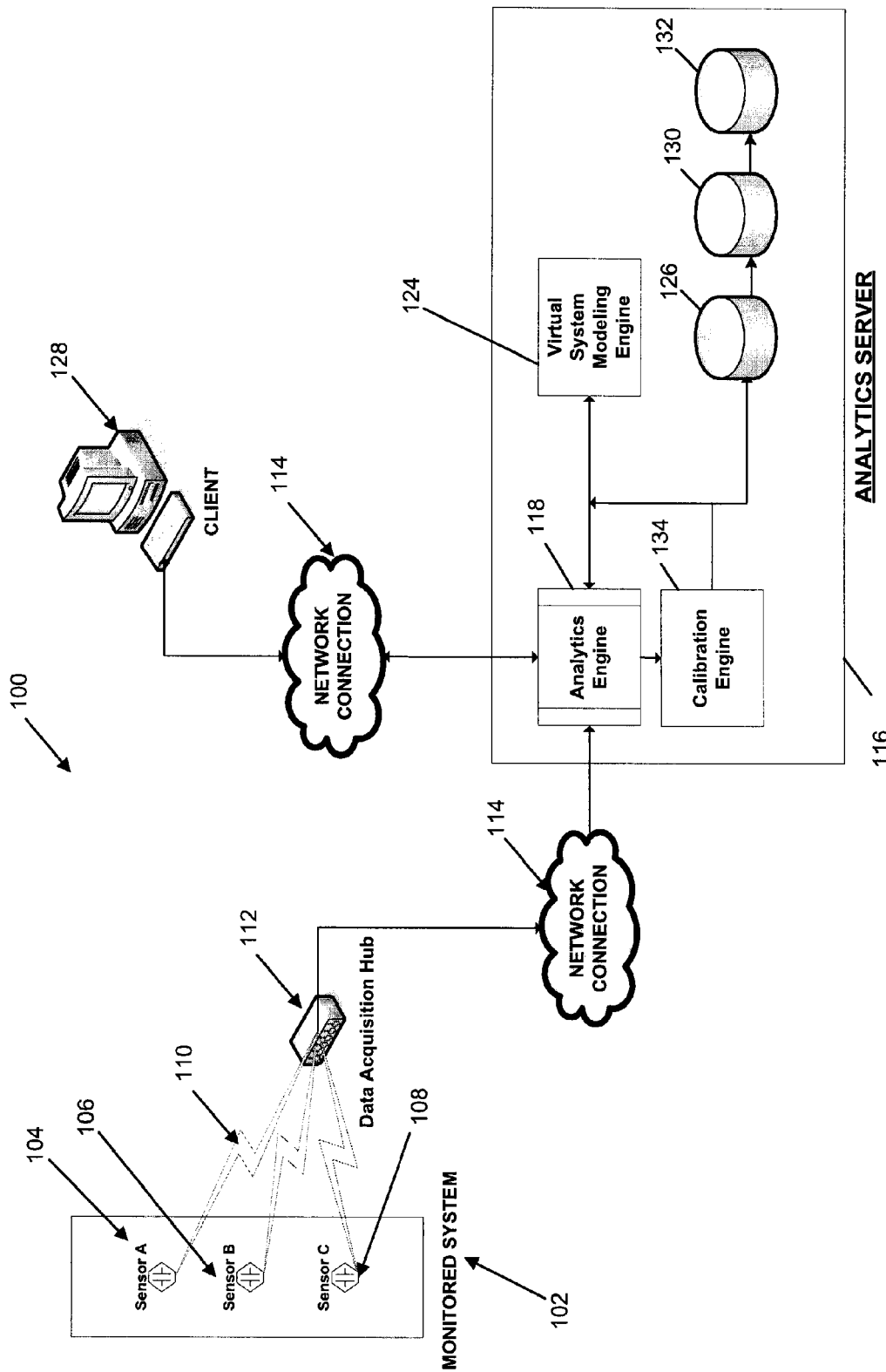
FIG. 1 is an illustration of a system for utilizing real-time data for predictive analysis of the performance of a monitored system, in accordance with one embodiment.

FIG. 1 is an illustration of a system for utilizing real-time data for predictive analysis of the performance of a monitored system, in accordance with one embodiment. As shown herein, the system 100 includes a series of sensors, i.e., Sensor A 104, Sensor B 106, Sensor C 108, interfaced with the various components of a monitored system 102, a data acquisition hub 112, an analytics server 116, and a thin-client device 128. In one embodiment, the monitored system 102 is an electrical power generation plant. In another embodiment, the monitored system 102 is an electrical power transmission infrastructure. In still another embodiment, the monitored system 102 is an electrical power distribution system. In still another embodiment, the monitored system 102 includes a combination of one or more electrical power generation plant(s), power transmission infrastructure(s), and/or an electrical power distribution system. It should be understood that the monitored system 102 can be any combination of components whose operations can be monitored with conventional sensors and where each component interacts with or is related to at least one other component within the combination. For a monitored system 102 that is an electrical power generation, transmission, or distribution system, the sensors can provide data such as voltage, frequency, current, power, power factor, and the like.

The sensors 104, 106 and 108 can be configured to provide output values for system parameters that indicate the operational status and/or "health" of the monitored system 102. For example, in an electrical power generation system, the current output or voltage readings for the various components that comprise the power generation system is indicative of the overall health and/or operational condition of the system. In one embodiment, the sensors are configured to also measure additional data that can affect system operation. For example, for an electrical power distribution system, the sensor output can include environmental information, e.g., temperature, humidity, etc., which can impact electrical power demand and can also affect the operation and efficiency of the power distribution system itself.

Continuing with FIG. 1, in one embodiment, the sensors 104, 106 and 108 can be configured to output data in an analog format. For example, electrical power sensor measurements, e.g., voltage, current, etc., are sometimes conveyed in an analog format as the measurements may be continuous in both time and amplitude. In another embodiment, the sensors 104, 106 and 108 can be configured to output data in a digital format. For example, the same electrical power sensor measurements can be taken in discrete time increments that are not continuous in time or amplitude. In still another embodiment, the sensors 104, 106 and 108 can be configured to output data in either an analog format, digital format, or both, depending on the sampling requirements of the monitored system 102.

The sensors 104, 106 and 108 can be configured to capture output data at split-second intervals to effectuate "real time" data capture. For example, in one embodiment, the sensors 104, 106 and 108 can be configured to generate hundreds of thousands of data readings per second. It should be appreciated, however, that the number of data output readings taken by a particular sensor can be set to any value as long as the operational limits of the sensor and the data processing capabilities of the data acquisition hub 112 are not exceeded.

Still referring to FIG. 1, each sensor 104, 106 and 108 can be communicatively connected to the data acquisition hub 112 via an analog or digital data connection 110. The data acquisition hub 112 can be a standalone unit or integrated within the analytics server 116 and can be embodied as a piece of hardware, software, or some combination thereof. In one embodiment, the data connection 110 is a "hard wired" physical data connection, e.g., serial, network, etc. For example, a serial or parallel cable connection between the sensor and the hub 112. In another embodiment, the data connection 110 is a wireless data connection. For example, a radio frequency (RF), BLUETOOTH™, infrared or equivalent connection between the sensor and the hub 112.

The data acquisition hub 112 can be configured to communicate "real-time" data from the monitored system 102 to the analytics server 116 using a network connection 114. In one embodiment, the network connection 114 is a "hardwired" physical connection. For example, the data acquisition hub 112 can be communicatively connected, e.g., via Category 5 (CAT5), fiber optic, or equivalent cabling, to a data server (not shown) that is communicatively connected, e.g., via CAT5, fiber optic, or equivalent cabling, through the Internet and to the analytics server 116 server. The analytics server 116 can also be communicatively connected with the Internet, e.g., via CAT5, fiber optic, or equivalent cabling. In another embodiment, the network connection 114 can be a wireless network connection, e.g., Wi-Fi, WLAN, etc. For example, utilizing an 802.11b/g or equivalent transmission format. In practice, the network connection used is dependent upon the particular requirements of the monitored system 102.

Data acquisition hub 112 can also be configured to supply warning and alarms signals as well as control signals to monitored system 102 and/or sensors 104, 106, and 108 as described in more detail below.

As shown in FIG. 1, in one embodiment, the analytics server 116 can host an analytics engine 118, virtual system modeling engine 124, and several databases 126, 130, and 132. The virtual system modeling engine 124 can, e.g., be a computer modeling system, such as described above. In this context, however, the modeling engine 124 can be used to precisely model and mirror the actual electrical system. Analytics engine 118 can be configured to generate predicted data for the monitored system and analyze difference between the predicted data and the real-time data received from hub 112.

Figure 2:
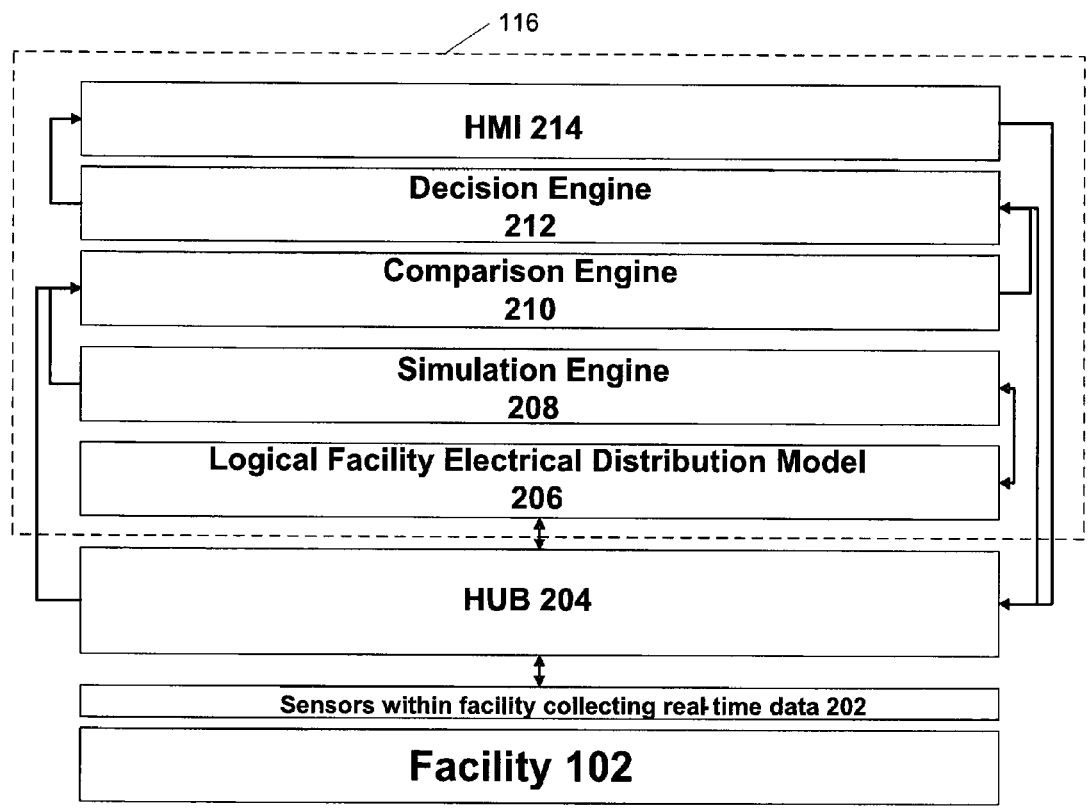
FIG. 2 is a diagram illustrating a detailed view of an analytics server included in the system of FIG. 1.

FIG. 2 is a diagram illustrating a more detailed view of analytic server 116. As can be seen, analytic server 116 is interfaced with a monitored facility 102 via sensors 202, e.g., sensors 104, 106, and 108. Sensors 202 are configured to supply real-time data from within monitored facility 102. The real-time data is communicated to analytic server 116 via a hub 204. Hub 204 can be configured to provide real-time data to server 116 as well as alarming, sensing, and control features for facility 102.

The real-time data from hub 204 can be passed to a comparison engine 210, which can form part of analytics engine 118. Comparison engine 210 can be configured to continuously compare the real-time data with predicted values generated by simulation engine 208. Based on the comparison, comparison engine 210 can be further configured to determine whether deviations between the real-time and the expected values exists, and if so to classify the deviation, e.g., high, marginal, low, etc. The deviation level can then be communicated to decision engine 212, which can also comprise part of analytics engine 118.

Decision engine 212 can be configured to look for significant deviations between the predicted values and real-time values as received from the comparison engine 210. If significant deviations are detected, decision engine 212 can also be configured to determine whether an alarm condition exists, activate the alarm and communicate the alarm to Human-Machine Interface (HMI) 214 for display in real-time via, e.g., thin client 128. Decision engine 212 can also be configured to perform root cause analysis for significant deviations in order to determine the interdependencies and identify the parent-child failure relationships that may be occurring. In this manner, parent alarm conditions are not drowned out by multiple children alarm conditions, allowing the user/operator to focus on the main problem, at least at first.

Thus, in one embodiment, and alarm condition for the parent can be displayed via HMI 214 along with an indication that processes and equipment dependent on the parent process or equipment are also in alarm condition. This also means that server 116 can maintain a parent-child logical relationship between processes and equipment comprising facility 102. Further, the processes can be classified as critical, essential, non-essential, etc.

Decision engine 212 can also be configured to determine health and performance levels and indicate these levels for the various processes and equipment via HMI 214. All of which, when combined with the analytic capabilities of analytics engine 118 allows the operator to minimize the risk of catastrophic equipment failure by predicting future failures and providing prompt, informative information concerning potential/predicted failures before they occur. Avoiding catastrophic failures reduces risk and cost, and maximizes facility performance and up time.

Simulation engine 208 operates on complex logical models 206 of facility 102. These models are continuously and automatically synchronized with the actual facility status based on the real-time data provided by hub 204. In other words, the models are updated based on current switch status, breaker status, e.g., open-closed, equipment on/off status, etc. Thus, the models are automatically updated based on such status, which allows simulation engine to produce predicted data based on the current facility status. This in turn, allows accurate and meaningful comparisons of the real-time data to the predicted data.

Example models 206 that can be maintained and used by server 116 include power flow models used to calculate expected kW, kVAR, power factor values, etc., short circuit models used to calculate maximum and minimum available fault currents, protection models used to determine proper protection schemes and ensure selective coordination of protective devices, power quality models used to determine voltage and current distortions at any point in the network, to name just a few. It will be understood that different models can be used depending on the system being modeled.

In certain embodiments, hub 204 is configured to supply equipment identification associated with the real-time data. This identification can be cross referenced with identifications provided in the models.

In one embodiment, if the comparison performed by comparison engine 210 indicates that the differential between the real-time sensor output value and the expected value exceeds a Defined Difference Tolerance (DDT) value, i.e., the "real-time" output values of the sensor output do not indicate an alarm condition, but below an alarm condition, i.e., alarm threshold value, a calibration request is generated by the analytics engine 118. If the differential exceeds the alarm condition, an alarm or notification message can be generated by the analytics engine 118. If the differential is below the DTT value, the analytics engine can do nothing and continues to monitor the real-time data and expected data.

In one embodiment, the alarm or notification message can be sent directly to the client or user) 128, e.g., via HMI 214, for display in real-time on a web browser, pop-up message box, e-mail, or equivalent on the client 128 display panel. In another embodiment, the alarm or notification message can be sent to a wireless mobile device, e.g., BLACKBERRY™, laptop, pager, etc., to be displayed for the user by way of a wireless router or equivalent device interfaced with the analytics server 116. In still another embodiment, the alarm or notification message can be sent to both the client 128 display and the wireless mobile device. The alarm can be indicative of a need for a repair event or maintenance to be done on the monitored system. It should be noted, however, that calibration requests should not be allowed if an alarm condition exists to prevent the models from being calibrated to an abnormal state.

Once the calibration is generated by the analytics engine 118, the various operating parameters or conditions of model(s) 206 can be updated or adjusted to reflect the actual facility configuration. This can include, but is not limited to, modifying the predicted data output from the simulation engine 208, adjusting the logic/processing parameters used by the model(s) 206, adding/subtracting functional elements from model(s) 206, etc. It should be understood that any operational parameter used by models 206 can be modified as long as the resulting modifications can be processed and registered by simulation engine 208.

Referring back to FIG. 1, models 206 can be stored in the virtual system model database 126. As noted, a variety of conventional virtual model applications can be used for creating a virtual system model, so that a wide variety of systems and system parameters can be modeled. For example, in the context of an electrical power distribution system, the virtual system model can include components for modeling reliability, modeling voltage stability, and modeling power flow. In addition, models 206 can include dynamic control logic that permits a user to configure the models 206 by specifying control algorithms and logic blocks in addition to combinations and interconnections of generators, governors, relays, breakers, transmission line, and the like. The voltage stability parameters can indicate capacity in terms of size, supply, and distribution, and can indicate availability in terms of remaining capacity of the presently configured system. The power flow model can specify voltage, frequency, and power factor, thus representing the "health" of the system.

All of models 206 can be referred to as a virtual system model. Thus, a virtual system model database 130 can be configured to store the virtual system model. A duplicate, but synchronized copy of the virtual system model can be stored in a virtual simulation model database 130. This duplicate model can be used for what-if simulations. In other words, this model can be used to allow a system designer to make hypothetical changes to the facility and test the resulting effect, without taking down the facility or costly and time consuming analysis. Such hypothetical can be used to learn failure patterns and signatures as well as to test proposed modifications, upgrades, additions, etc., for the facility. The real-time data, as well as trending produced by analytics engine 118 can be stored in a real-time data acquisition database 132.

As discussed above, the virtual system model is periodically calibrated and synchronized with "real-time" sensor data outputs so that the virtual system model provides data output values that are consistent with the actual "real-time" values received from the sensor output signals. Unlike conventional systems that use virtual system models primarily for system design and implementation purposes, i.e., offline simulation and facility planning, the virtual system models described herein are updated and calibrated with the real-time system operational data to provide better predictive output values. A divergence between the real-time sensor output values and the predicted output values generate either an alarm condition for the values in question and/or a calibration request that is sent to the calibration engine 134.

Continuing with FIG. 1, the analytics engine 118 can be configured to implement pattern/sequence recognition into a real-time decision loop that, e.g., is enabled by a new type of machine learning called associative memory, or hierarchical temporal memory (HTM), which is a biological approach to learning and pattern recognition. Associative memory allows storage, discovery, and retrieval of learned associations between extremely large numbers of attributes in real time. At a basic level, an associative memory stores information about how attributes and their respective features occur together. The predictive power of the associative memory technology comes from its ability to interpret and analyze these co-occurrences and to produce various metrics. Associative memory is built through "experiential" learning in which each newly observed state is accumulated in the associative memory as a basis for interpreting future events. Thus, by observing normal system operation over time, and the normal predicted system operation over time, the associative memory is able to learn normal patterns as a basis for identifying non-normal behavior and appropriate responses, and to associate patterns with particular outcomes, contexts or responses. The analytics engine 118 is also better able to understand component mean time to failure rates through observation and system availability characteristics. This technology in combination with the virtual system model can be characterized as a "neocortical" model of the system under management This approach also presents a novel way to digest and comprehend alarms in a manageable and coherent way. The neocortical model could assist in uncovering the patterns and sequencing of alarms to help pinpoint the location of the (impending) failure, its context, and even the cause. Typically, responding to the alarms is done manually by experts who have gained familiarity with the system through years of experience. However, at times, the amount of information is so great that an individual cannot respond fast enough or does not have the necessary expertise. An "intelligent" system like the neocortical system that observes and recommends possible responses could improve the alarm management process by either supporting the existing operator, or even managing the system autonomously.

Current simulation approaches for maintaining transient stability involve traditional numerical techniques and typically do not test all possible scenarios. The problem is further complicated as the numbers of components and pathways increase. Through the application of the neocortical model, by observing simulations of circuits, and by comparing them to actual system responses, it may be possible to improve the simulation process, thereby improving the overall design of future circuits.

The virtual system model database 126, as well as databases 130 and 132, can be configured to store one or more virtual system models, virtual simulation models, and real-time data values, each customized to a particular system being monitored by the analytics server 118. Thus, the analytics server 118 can be used to monitor more than one system at a time. As depicted herein, the databases 126, 130, and 132 can be hosted on the analytics server 116 and communicatively interfaced with the analytics engine 118. In other embodiments, databases 126, 130, and 132 can be hosted on a separate database server (not shown) that is communicatively connected to the analytics server 116 in a manner that allows the virtual system modeling engine 124 and analytics engine 118 to access the databases as needed.

Therefore, in one embodiment, the client 128 can modify the virtual system model stored on the virtual system model database 126 by using a virtual system model development interface using well-known modeling tools that are separate from the other network interfaces. For example, dedicated software applications that run in conjunction with the network interface to allow a client 128 to create or modify the virtual system models.

The client 128 can use a variety of network interfaces, e.g., web browser, CITRIX™, WINDOWS TERMINAL SERVICES™, telnet, or other equivalent thin-client terminal applications, etc., to access, configure, and modify the sensors, e.g., configuration files, etc., analytics engine 118, e.g., configuration files, analytics logic, etc., calibration parameters, e.g., configuration files, calibration parameters, etc., virtual system modeling engine 124, e.g., configuration files, simulation parameters, etc., and virtual system model of the system under management, e.g., virtual system model operating parameters and configuration files. Correspondingly, data from those various components of the monitored system 102 can be displayed on a client 128 display panel for viewing by a system administrator or equivalent.

Figure 3:
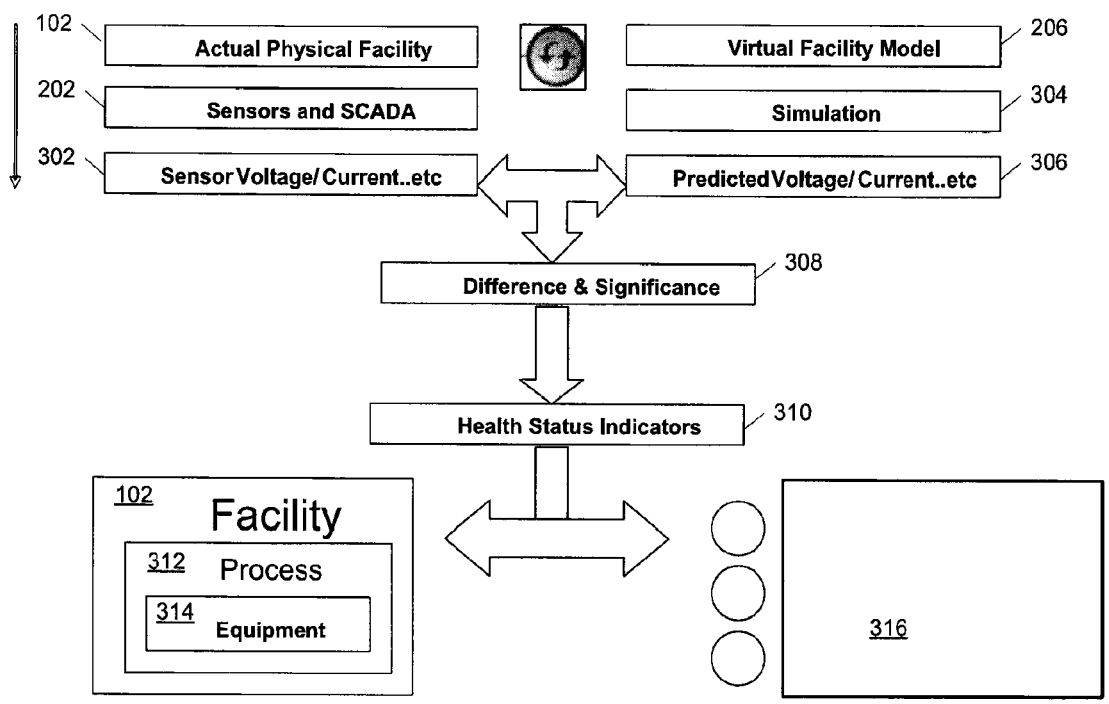
FIG. 3 is a diagram illustrating how the system of FIG. 1 operates to synchronize the operating parameters between a physical facility and a virtual system model of the facility.

As described above, server 116 is configured to synchronize the physical world with the virtual and report, e.g., via visual, real-time display, deviations between the two as well as system health, alarm conditions, predicted failures, etc. This is illustrated with the aid of FIG. 3, in which the synchronization of the physical world (left side) and virtual world (right side) is illustrated. In the physical world, sensors 202 produce real-time data 302 for the processes 312 and equipment 314 that make up facility 102. In the virtual world, simulations 304 of the virtual system model 206 provide predicted values 306, which are correlated and synchronized with the real-time data 302. The real-time data can then be compared to the predicted values so that differences 308 can be detected. The significance of these differences can be determined to determine the health status 310 of the system. The health stats can then be communicated to the processes 312 and equipment 314, e.g., via alarms and indicators, as well as to thin client 128, e.g., via web pages 316.

Figure 4:
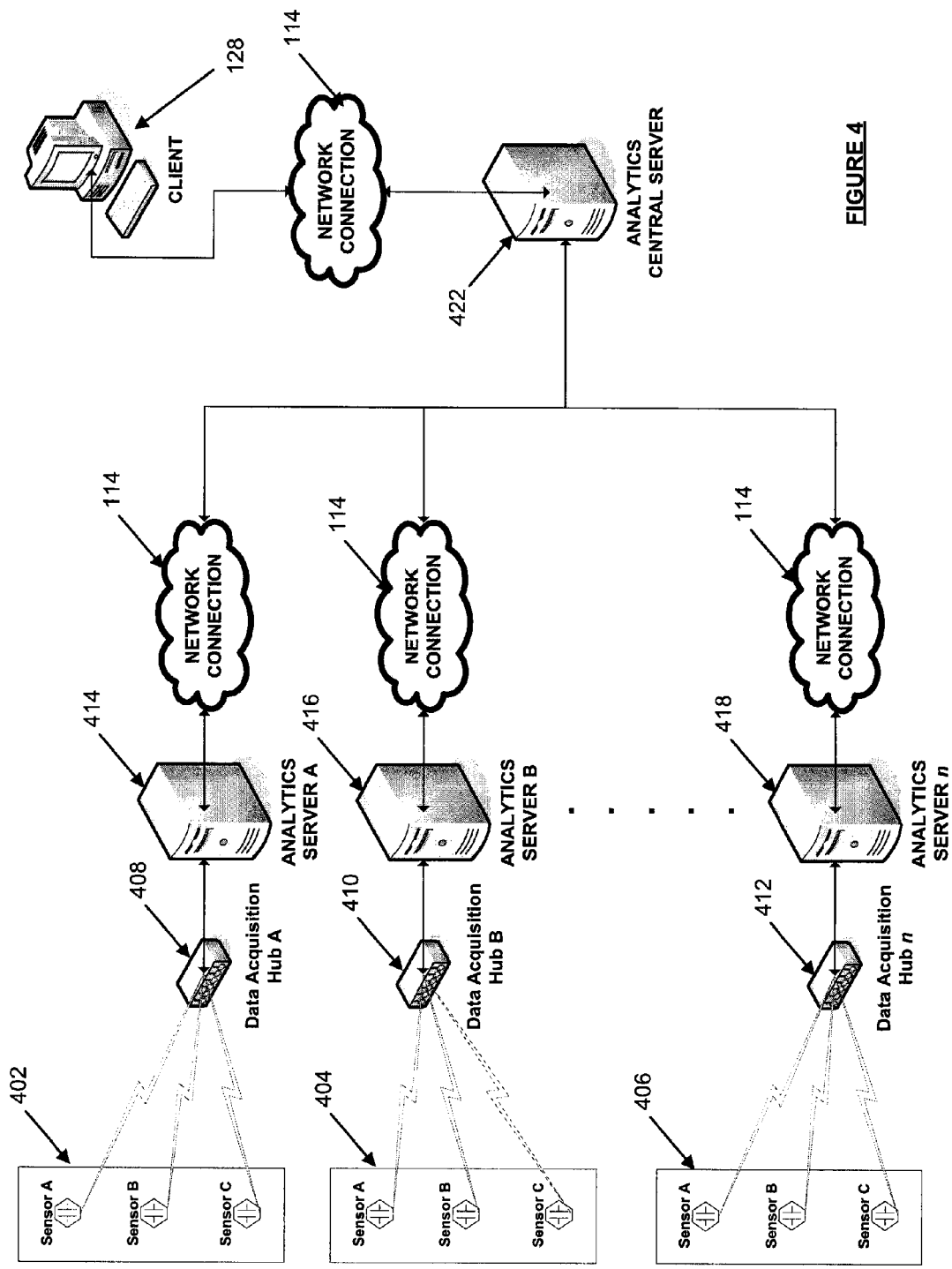
FIG. 4 is an illustration of the scalability of a system for utilizing real-time data for predictive analysis of the performance of a monitored system, in accordance with one embodiment.

FIG. 4 is an illustration of the scalability of a system for utilizing real-time data for predictive analysis of the performance of a monitored system, in accordance with one embodiment. As depicted herein, an analytics central server 422 is communicatively connected with analytics server A 414, analytics server B 416, and analytics server n 418, i.e., one or more other analytics servers, by way of one or more network connections 114. Each of the analytics servers 414, 416, and 418 is communicatively connected with a respective data acquisition hub, i.e., Hub A 408, Hub B 410, Hub n 412, which communicates with one or more sensors that are interfaced with a system, i.e., Monitored System A 402, Monitored System B 404, Monitored System n 406, which the respective analytical server monitors. For example, analytics server A 414 is communicative connected with data acquisition hub A 408, which communicates with one or more sensors interfaced with monitored system A 402.

Each analytics server, i.e., analytics server A 414, analytics server B 416, analytics server n 418, can be configured to monitor the sensor output data of its corresponding monitored system and feed that data to the central analytics server 422. Additionally, each of the analytics servers 414, 416 and 418 can function as a proxy agent of the central analytics server 422 during the modifying and/or adjusting of the operating parameters of the system sensors they monitor. For example, analytics server B 416 can be configured as a proxy to modify the operating parameters of the sensors interfaced with monitored system B 404.

Moreover, the central analytics server 422, which is communicatively connected to one or more analytics server(s), can be used to enhance the scalability. For example, a central analytics server 422 can be used to monitor multiple electrical power generation facilities, i.e., monitored system A 402 can be a power generation facility located in city A while monitored system B 404 is a power generation facility located in city B, on an electrical power grid. In this example, the number of electrical power generation facilities that can be monitored by central analytics server 422 is limited only by the data processing capacity of the central analytics server 422. The central analytics server 422 can be configured to enable a client 128 to modify and adjust the operational parameters of any the analytics servers communicatively connected to the central analytics server 422. Furthermore, as discussed above, each of the analytics servers 414, 416 and 418 can be configured to serve as proxies for the central analytics server 422 to enable a client 128 to modify and/or adjust the operating parameters of the sensors interfaced with the systems that they respectively monitor. For example, the client 128 can use the central analytics server 422, and vice versa, to modify and/or adjust the operating parameters of analytics server A 414 and use the same to modify and/or adjust the operating parameters of the sensors interfaced with monitored system A 402. Additionally, each of the analytics servers can be configured to allow a client 128 to modify the virtual system model through a virtual system model development interface using well-known modeling tools.

In one embodiment, the central analytics server 422 can function to monitor and control a monitored system when its corresponding analytics server is out of operation. For example, central analytics server 422 can take over the functionality of analytics server B 416 when the server 416 is out of operation. That is, the central analytics server 422 can monitor the data output from monitored system B 404 and modify and/or adjust the operating parameters of the sensors that are interfaced with the system 404.

In one embodiment, the network connection 114 is established through a wide area network (WAN) such as the Internet. In another embodiment, the network connection is established through a local area network (LAN) such as the company intranet. In a separate embodiment, the network connection 114 is a "hardwired" physical connection. For example, the data acquisition hub 112 can be communicatively connected, e.g., via Category 5 (CAT5), fiber optic, or equivalent cabling, to a data server that is communicatively connected, e.g., via CAT5, fiber optic, or equivalent cabling, through the Internet and to the analytics server 116 server hosting the analytics engine 118. In another embodiment, the network connection 114 is a wireless network connection, e.g., Wi-Fi, WLAN, etc. For example, utilizing an 802.11b/g or equivalent transmission format.

In certain embodiments, regional analytics servers can be placed between local analytics servers 414, 416, . . . , 418 and central analytics server 422. Further, in certain embodiments a disaster recovery site can be included at the central analytics server 422 level.

Figure 5:
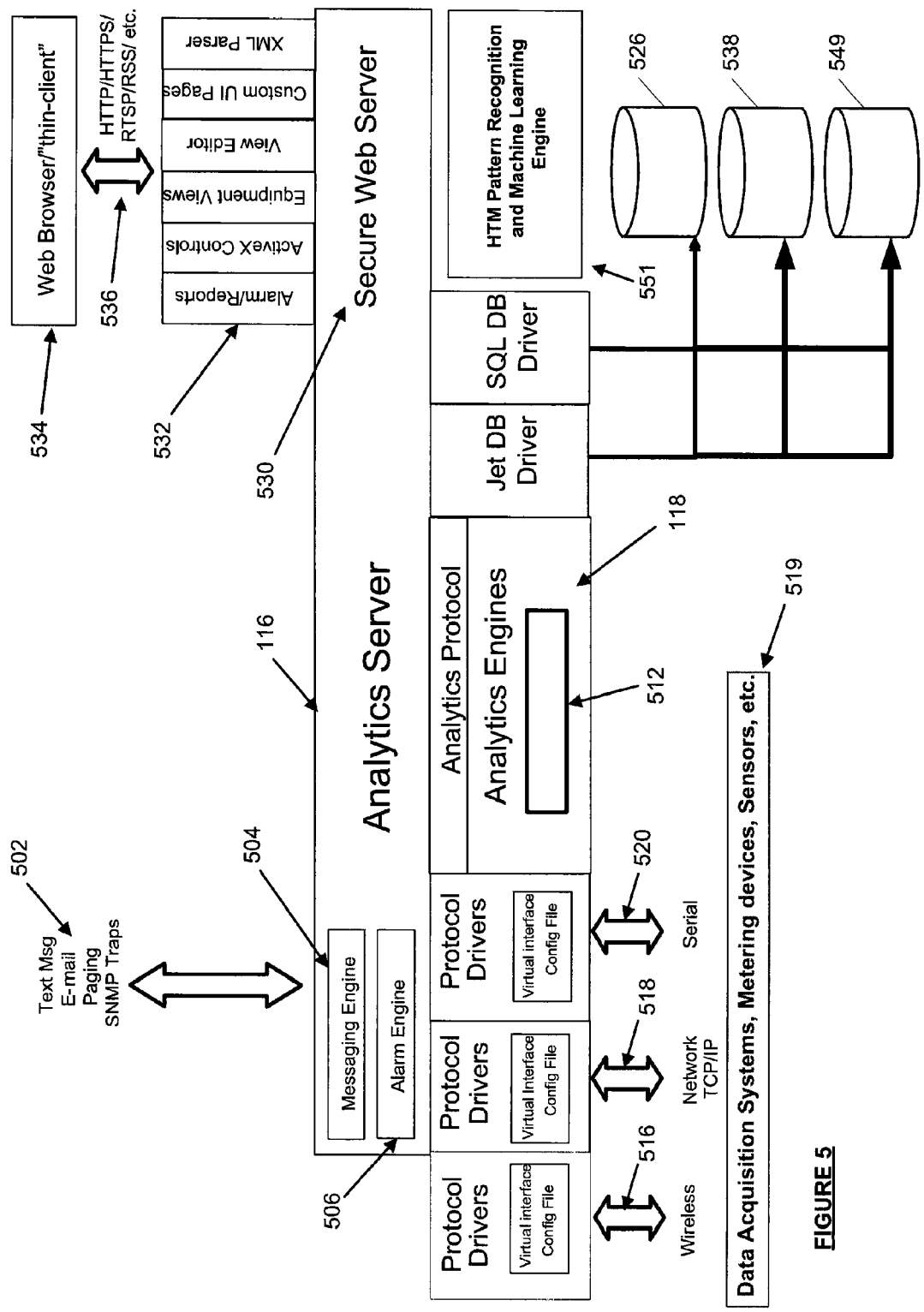
FIG. 5 is a block diagram that shows the configuration details of the system illustrated in FIG. 1, in accordance with one embodiment.

FIG. 5 is a block diagram that shows the configuration details of analytics server 116 illustrated in FIG. 1 in more detail. It should be understood that the configuration details in FIG. 5 are merely one embodiment of the items described for FIG. 1, and it should be understood that alternate configurations and arrangements of components could also provide the functionality described herein.

The analytics server 116 includes a variety of components. In the example of FIG. 5, the analytics server 116 is implemented in a Web-based configuration, so that the analytics server 116 includes, or communicates with, a secure web server 530 for communication with the sensor systems 519, e.g., data acquisition units, metering devices, sensors, etc., and external communication entities 534, e.g., web browser, "thin client" applications, etc. A variety of user views and functions 532 are available to the client 128 such as: alarm reports, Active X controls, equipment views, view editor tool, custom user interface page, and XML parser. It should be appreciated, however, that these are just examples of a few in a long list of views and functions 532 that the analytics server 116 can deliver to the external communications entities 534 and are not meant to limit the types of views and functions 532 available to the analytics server 116 in any way.

The analytics server 116 also includes an alarm engine 506 and messaging engine 504, for the aforementioned external communications. The alarm engine 506 is configured to work in conjunction with the messaging engine 504 to generate alarm or notification messages 502, in the form of text messages, e-mails, paging, etc., in response to the alarm conditions previously described. The analytics server 116 determines alarm conditions based on output data it receives from the various sensor systems 519 through a communications connection, e.g., wireless 516, TCP/IP 518, Serial 520, etc., and simulated output data from a virtual system model 512, of the monitored system, processed by the analytics engines 118. In one embodiment, the virtual system model 512 can be created by a user through interacting with an external communication entity 534 by specifying the components that comprise the monitored system and by specifying relationships between the components of the monitored system. In another embodiment, the virtual system model 512 can be automatically generated by the analytics engines 118 as components of the monitored system are brought online and interfaced with the analytics server 508.

Continuing with FIG. 5, a virtual system model database 526 can be communicatively connected with the analytics server 116 and can be configured to store one or more virtual system models 512, each of which represents a particular monitored system. For example, the analytics server 116 can conceivably monitor multiple electrical power generation systems, e.g., system A, system B, system C, etc., spread across a wide geographic area, e.g., City A, City B, City C, etc. Therefore, the analytics server 116 can use a different virtual system model 512 for each of the electrical power generation systems that it monitors. Virtual simulation model database 538 can be configured to store a synchronized, duplicate copy of the virtual system model 512, and real-time data acquisition database 540 can store the real-time and trending data for the system(s) being monitored.

Thus, in operation, analytics server 116 can receive real-time data for various sensors, i.e., components, through data acquisition system 202. As can be seen, analytics server 116 can comprise various drivers configured to interface with the various types of sensors, etc., comprising data acquisition system 202. This data represents the real-time operational data for the various components. For example, the data can indicate that a certain component is operating at a certain voltage level and drawing certain amount of current. This information can then be fed to a modeling engine to generate a virtual system model 512 that is based on the actual real-time operational data.

Analytics engine 118 can be configured to compare predicted data based on the virtual system model 512 with real-time data received from data acquisition system 202 and to identify any differences. In some instances, analytics engine can be configured to identify these differences and then update, i.e., calibrate, the virtual system model 512 for use in future comparisons. In this manner, more accurate comparisons and warnings can be generated.

But in other instances, the differences will indicate a failure, or the potential for a failure. For example, when a component begins to fail, the operating parameters will begin to change. This change may be sudden or it may be a progressive change over time. Analytics engine 118 can detect such changes and issue warnings that can allow the changes to be detected before a failure occurs. The analytic engine 118 can be configured to generate warnings that can be communicated via interface 532.

For example, a user can access information from server 116 using thin client 534. For example, reports can be generate and served to thin client 534 via server 540. These reports can, for example, comprise schematic or symbolic illustrations of the system being monitored. Status information for each component can be illustrated or communicated for each component. This information can be numerical, i.e., the voltage or current level, or it can be symbolic, i.e., green for normal, red for failure or warning. In certain embodiments, intermediate levels of failure can also be communicated, i.e., yellow can be used to indicate operational conditions that project the potential for future failure. It should be noted that this information can be accessed in real-time. Moreover, via thin client 534, the information can be accessed from anywhere and anytime.

Continuing with FIG. 5, the Analytics Engine 118 is communicatively interfaced with a HTM pattern recognition and machine learning engine 551. The HTM engine 551 can be configured to work in conjunction with the analytics engine 118 and a virtual system model of the monitored system to make real-time predictions, i.e., forecasts, about various operational aspects of the monitored system. The HTM engine 551 works by processing and storing patterns observed during the normal operation of the monitored system over time. These observations are provided in the form of real-time data captured using a multitude of sensors that are imbedded within the monitored system. In one embodiment, the virtual system model can also be updated with the real-time data such that the virtual system model "ages" along with the monitored system. Examples of a monitored system can include machinery, factories, electrical systems, processing plants, devices, chemical processes, biological systems, data centers, aircraft carriers, and the like. It should be understood that the monitored system can be any combination of components whose operations can be monitored with conventional sensors and where each component interacts with or is related to at least one other component within the combination.

Figure 6:
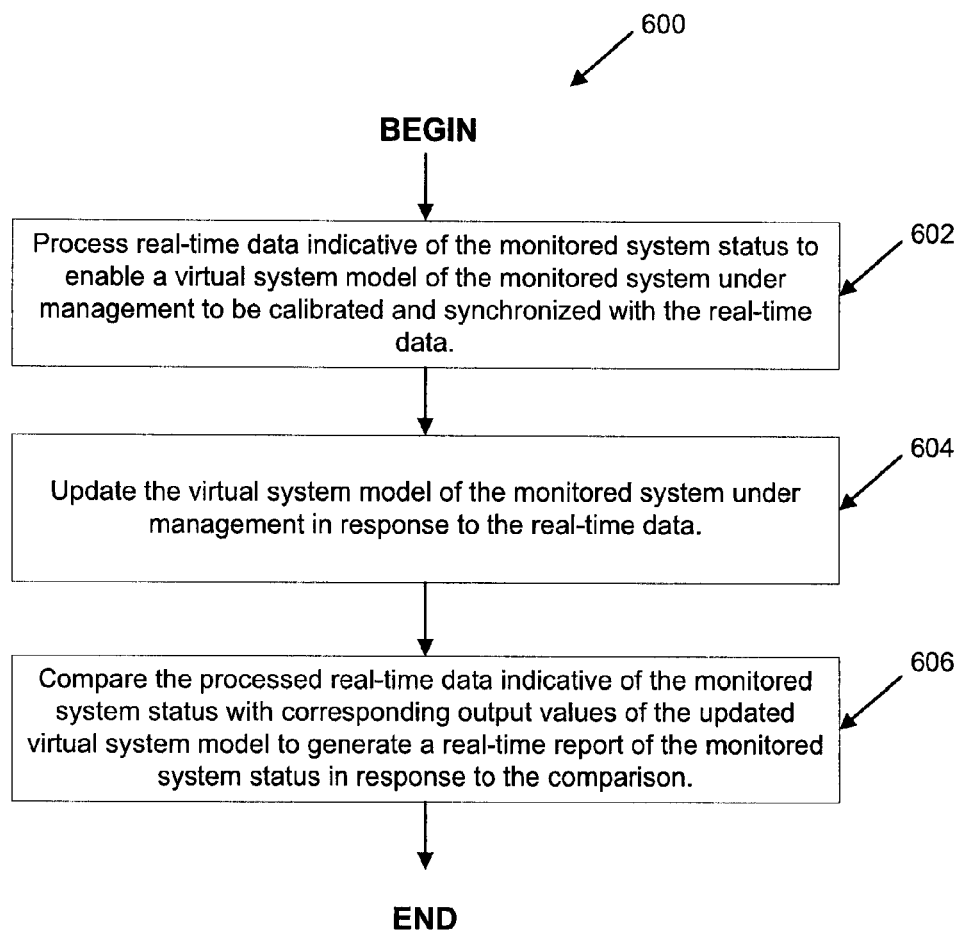
FIG. 6 is an illustration of a flowchart describing a method for real-time monitoring and predictive analysis of a monitored system, in accordance with one embodiment.

FIG. 6 is a flowchart describing a method for real-time monitoring and predictive analysis of a monitored system, in accordance with one embodiment. Method 600 begins with operation 602 where real-time data indicative of the monitored system status is processed to enable a virtual model of the monitored system under management to be calibrated and synchronized with the real-time data. In one embodiment, the monitored system 102 is a mission critical electrical power system. In another embodiment, the monitored system 102 can include an electrical power transmission infrastructure. In still another embodiment, the monitored system 102 includes a combination of thereof. It should be understood that the monitored system 102 can be any combination of components whose operations can be monitored with conventional sensors and where each component interacts with or is related to at least one other component within the combination.

Method 600 moves on to operation 604 where the virtual system model of the monitored system under management is updated in response to the real-time data. This may include, but is not limited to, modifying the simulated data output from the virtual system model, adjusting the logic/processing parameters utilized by the virtual system modeling engine to simulate the operation of the monitored system, adding/subtracting functional elements of the virtual system model, etc. It should be understood, that any operational parameter of the virtual system modeling engine and/or the virtual system model may be modified by the calibration engine as long as the resulting modifications can be processed and registered by the virtual system modeling engine.

Method 600 proceeds on to operation 606 where the simulated real-time data indicative of the monitored system status is compared with a corresponding virtual system model created at the design stage. The design stage models, which may be calibrated and updated based on real-time monitored data, are used as a basis for the predicted performance of the system. The real-time monitored data can then provide the actual performance over time. By comparing the real-time data with the predicted performance information, difference can be identified a tracked by, e.g., the analytics engine 118. Analytics engines 118 can then track trends, determine alarm states, etc., and generate a real-time report of the system status in response to the comparison.

In other words, the analytics can be used to analyze the comparison and real-time data and determine if there is a problem that should be reported and what level the problem may be, e.g., low priority, high priority, critical, etc. The analytics can also be used to predict future failures and time to failure, etc. In one embodiment, reports can be displayed on a conventional web browser (e.g. INTERNET EXPLORER™, FIREFOX™, NETSCAPE™, etc., which can be rendered on a standard personal computing (PC) device. In another embodiment, the "real-time" report can be rendered on a "thin-client" computing device, e.g., CITRIX™, WINDOWS TERMINAL SERVICES™, telnet, or other equivalent thin-client terminal application. In still another embodiment, the report can be displayed on a wireless mobile device, e.g., BLACKBERRY™, laptop, pager, etc. For example, in one embodiment, the "real-time" report can include such information as the differential in a particular power parameter, i.e., current, voltage, etc., between the real-time measurements and the virtual output data.

Figure 7:
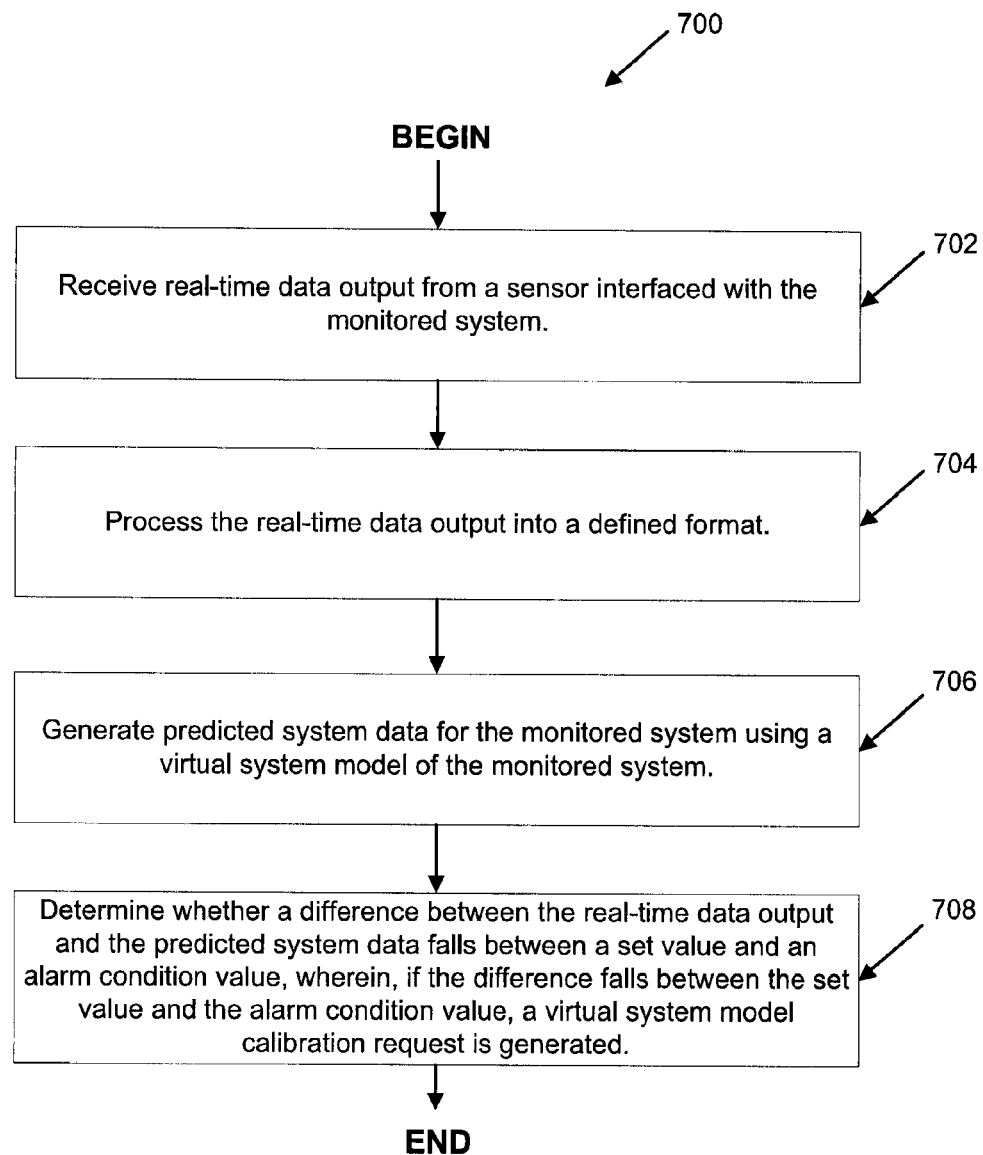
FIG. 7 is an illustration of a flowchart describing a method for managing real-time updates to a virtual system model of a monitored system, in accordance with one embodiment.

FIG. 7 is a flowchart describing a method for managing real-time updates to a virtual system model of a monitored system, in accordance with one embodiment. Method 700 begins with operation 702 where real-time data output from a sensor interfaced with the monitored system is received. The sensor is configured to capture output data at split-second intervals to effectuate "real time" data capture. For example, in one embodiment, the sensor is configured to generate hundreds of thousands of data readings per second. It should be appreciated, however, that the number of data output readings taken by the sensor may be set to any value as long as the operational limits of the sensor and the data processing capabilities of the data acquisition hub are not exceeded.

Method 700 moves to operation 704 where the real-time data is processed into a defined format. This would be a format that can be used by the analytics server to analyze or compare the data with the simulated data output from the virtual system model. In one embodiment, the data is converted from an analog signal to a digital signal. In another embodiment, the data is converted from a digital signal to an analog signal. It should be understood, however, that the real-time data may be processed into any defined format as long as the analytics engine can utilize the resulting data in a comparison with simulated output data from a virtual system model of the monitored system.

Method 700 continues on to operation 706 where the predicted, i.e., simulated, data for the monitored system is generated using a virtual system model of the monitored system. As discussed above, a virtual system modeling engine uses dynamic control logic stored in the virtual system model to generate the predicted output data. The predicted data is supposed to be representative of data that should actually be generated and output from the monitored system.

Method 700 proceeds to operation 708 where a determination is made as to whether the difference between the real-time data output and the predicted system data falls between a set value and an alarm condition value, where if the difference falls between the set value and the alarm condition value a virtual system model calibration and a response can be generated. That is, if the comparison indicates that the differential between the "real-time" sensor output value and the corresponding "virtual" model data output value exceeds a Defined Difference Tolerance (DDT) value, i.e., the "real-time" output values of the sensor output do not indicate an alarm condition, but below an alarm condition, i.e., alarm threshold value, a response can be generated by the analytics engine. In one embodiment, if the differential exceeds, the alarm condition, an alarm or notification message is generated by the analytics engine 118. In another embodiment, if the differential is below the DTT value, the analytics engine does nothing and continues to monitor the "real-time" data and "virtual" data. Generally speaking, the comparison of the set value and alarm condition is indicative of the functionality of one or more components of the monitored system.

Figure 8:
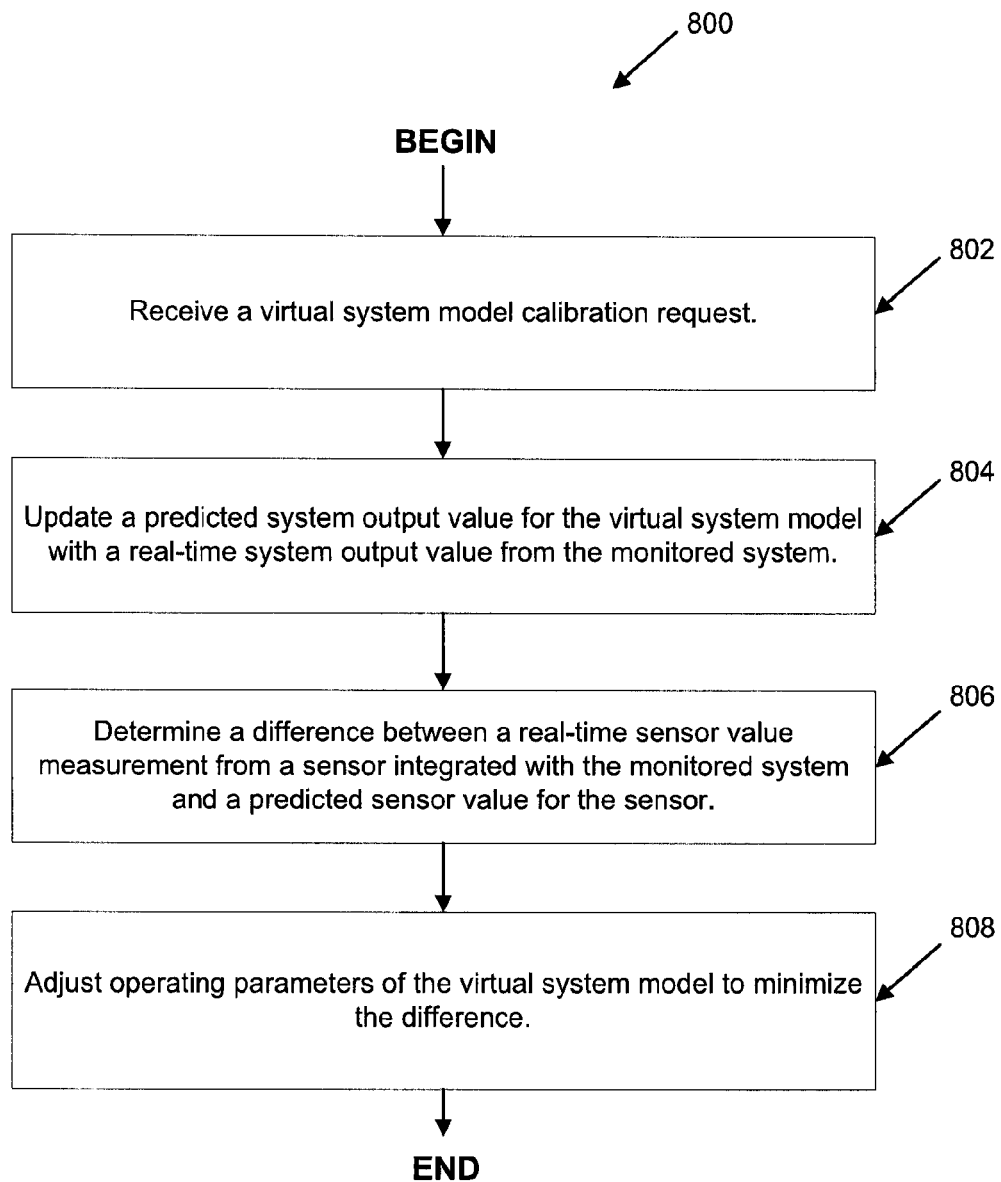
FIG. 8 is an illustration of a flowchart describing a method for synchronizing real-time system data with a virtual system model of a monitored system, in accordance with one embodiment.

FIG. 8 is a flowchart describing a method for synchronizing real-time system data with a virtual system model of a monitored system, in accordance with one embodiment. Method 800 begins with operation 802 where a virtual system model calibration request is received. A virtual model calibration request can be generated by an analytics engine whenever the difference between the real-time data output and the predicted system data falls between a set value and an alarm condition value.

Method 800 proceeds to operation 804 where the predicted system output value for the virtual system model is updated with a real-time output value for the monitored system. For example, if sensors interfaced with the monitored system outputs a real-time current value of A, then the predicted system output value for the virtual system model is adjusted to reflect a predicted current value of A.

Method 800 moves on to operation 806 where a difference between the real-time sensor value measurement from a sensor integrated with the monitored system and a predicted sensor value for the sensor is determined. As discussed above, the analytics engine is configured to receive "real-time" data from sensors interfaced with the monitored system via the data acquisition hub, or, alternatively directly from the sensors, and "virtual" data from the virtual system modeling engine simulating the data output from a virtual system model of the monitored system. In one embodiment, the values are in units of electrical power output, i.e., current or voltage, from an electrical power generation or transmission system. It should be appreciated, however, that the values can essentially be any unit type as long as the sensors can be configured to output data in those units or the analytics engine can convert the output data received from the sensors into the desired unit type before performing the comparison.

Method 800 continues on to operation 808 where the operating parameters of the virtual system model are adjusted to minimize the difference. This means that the logic parameters of the virtual system model that a virtual system modeling engine uses to simulate the data output from actual sensors interfaced with the monitored system are adjusted so that the difference between the real-time data output and the simulated data output is minimized. Correspondingly, this operation will update and adjust any virtual system model output parameters that are functions of the virtual system model sensor values. For example, in a power distribution environment, output parameters of power load or demand factor might be a function of multiple sensor data values. The operating parameters of the virtual system model that mimic the operation of the sensor will be adjusted to reflect the real-time data received from those sensors. In one embodiment, authorization from a system administrator is requested prior to the operating parameters of the virtual system model being adjusted. This is to ensure that the system administrator is aware of the changes that are being made to the virtual system model. In one embodiment, after the completion of all the various calibration operations, a report is generated to provide a summary of all the adjustments that have been made to the virtual system model.

As described above, virtual system modeling engine 124 can be configured to model various aspects of the system to produce predicted values for the operation of various components within monitored system 102. These predicted values can be compared to actual values being received via data acquisition hub 112. If the differences are greater than a certain threshold, e.g., the DTT, but not in an alarm condition, then a calibration instruction can be generated. The calibration instruction can cause a calibration engine 134 to update the virtual model being used by system modeling engine 124 to reflect the new operating information.

It will be understood that as monitored system 102 ages, or more specifically the components comprising monitored system 102 age, then the operating parameters, e.g., currents and voltages associated with those components will also change. Thus, the process of calibrating the virtual model based on the actual operating information provides a mechanism by which the virtual model can be aged along with the monitored system 102 so that the comparisons being generated by analytics engine 118 are more meaningful.

Figure 9:
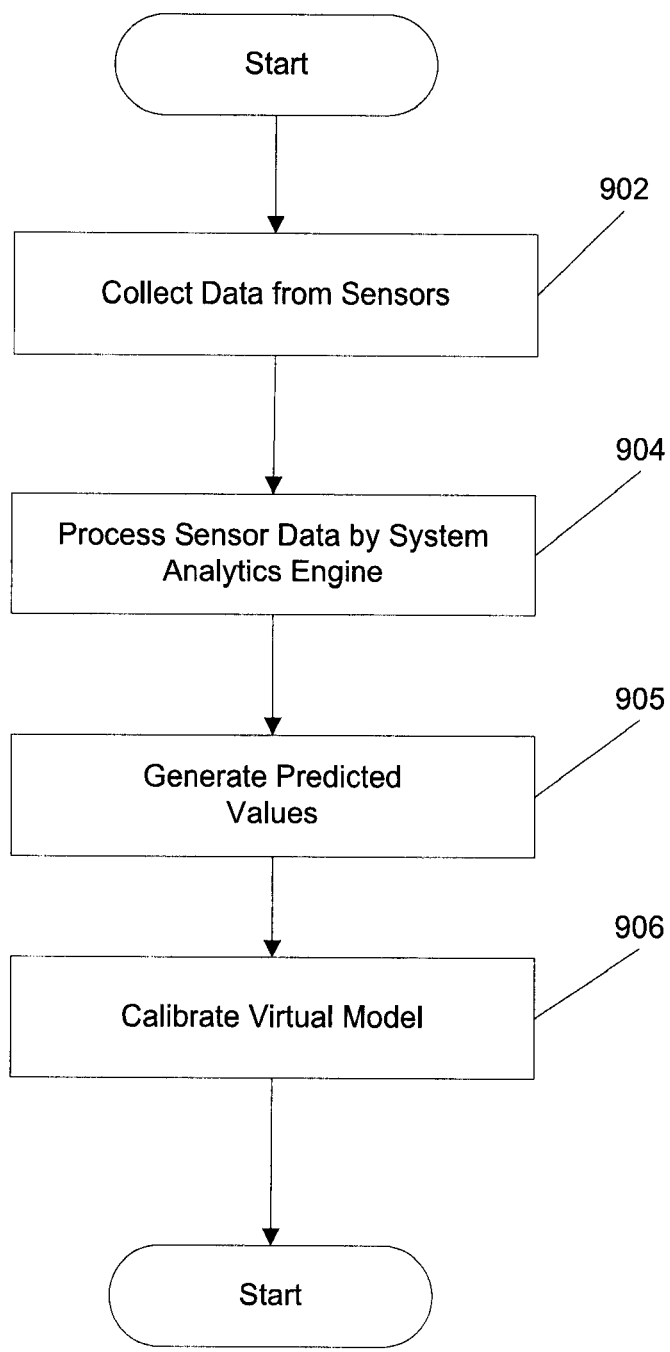
FIG. 9 is a flow chart illustrating an example method for updating the virtual model in accordance with one embodiment.

At a high level, this process can be illustrated with the aid of FIG. 9, which is a flow chart illustrating an example method for updating the virtual model in accordance with one embodiment. In step 902, data is collected from, e.g., sensors 104, 106, and 108. For example, the sensors can be configured to monitor protective devices within an electrical distribution system to determine and monitor the ability of the protective devices to withstand faults, which is describe in more detail below.

In step 904, the data from the various sensors can be processed by analytics engine 118 in order to evaluate various parameters related to monitored system 102. In step 905, simulation engine 124 can be configured to generate predicted values for monitored system 102 using a virtual model of the system that can be compared to the parameters generated by analytics engine 118 in step 904. If there are differences between the actual values and the predicted values, then the virtual model can be updated to ensure that the virtual model ages with the actual system 102.

It should be noted that as the monitored system 102 ages, various components can be repaired, replaced, or upgraded, which can also create differences between the simulated and actual data that is not an alarm condition. Such activity can also lead to calibrations of the virtual model to ensure that the virtual model produces relevant predicted values. Thus, not only can the virtual model be updated to reflect aging of monitored system 102, but it can also be updated to reflect retrofits, repairs, etc.

As noted above, in certain embodiments, a logical model of a facilities electrical system, a data acquisition system (data acquisition hub 112), and power system simulation engines (modeling engine 124) can be integrated with a logic and methods based approach to the adjustment of key database parameters within a virtual model of the electrical system to evaluate the ability of protective devices within the electrical distribution system to withstand faults and also effectively "age" the virtual system with the actual system.

Only through such a process can predictions on the withstand abilities of protective devices, and the status, security and health of an electrical system be accurately calculated. Accuracy is important as the predictions can be used to arrive at actionable, mission critical or business critical conclusions that may lead to the re-alignment of the electrical distribution system for optimized performance or security.

Figure 10:
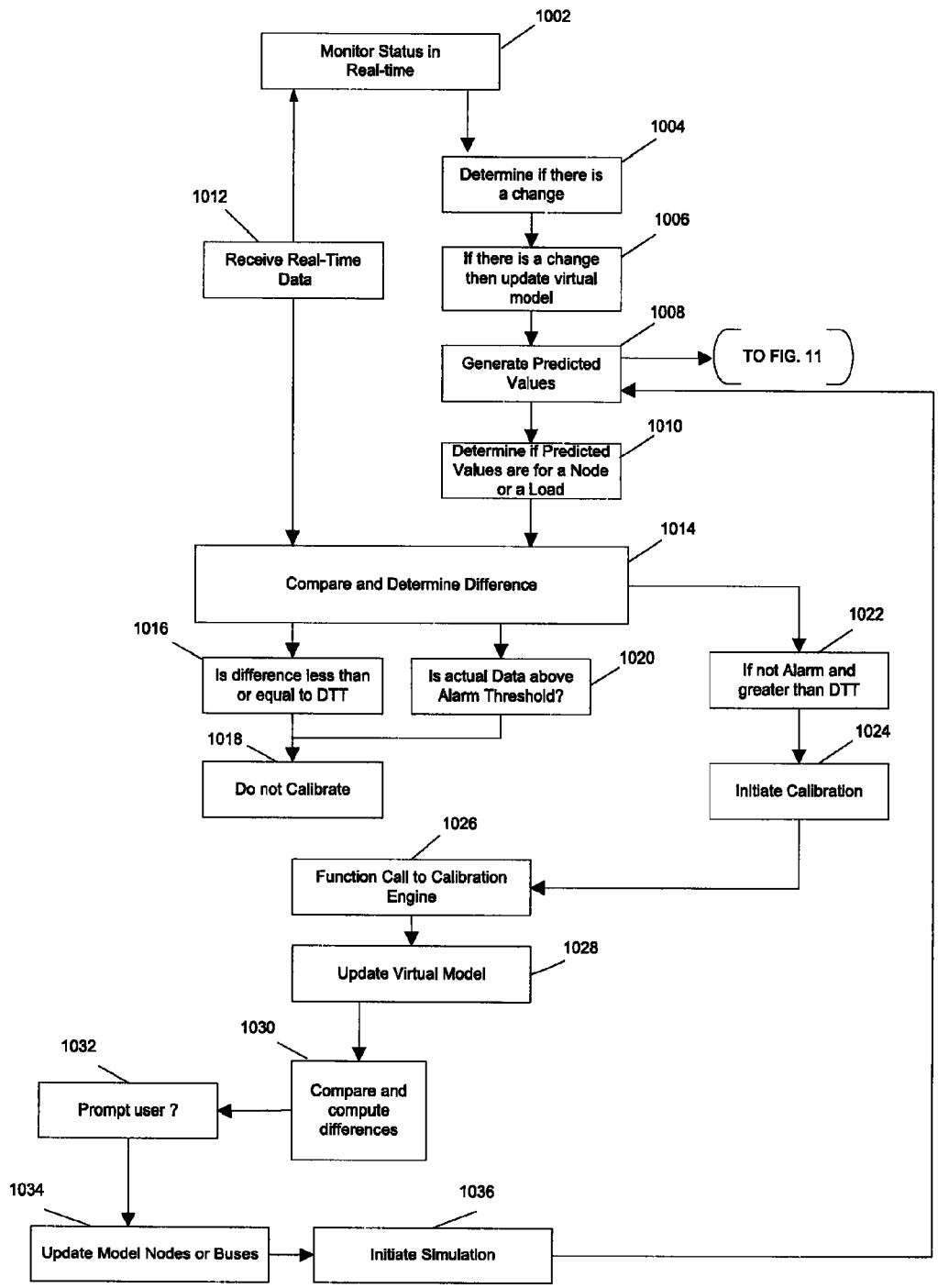
FIG. 10 is a diagram illustrating an example process for monitoring the status of protective devices in a monitored system and updating a virtual model based on monitored data.
Figure 11:
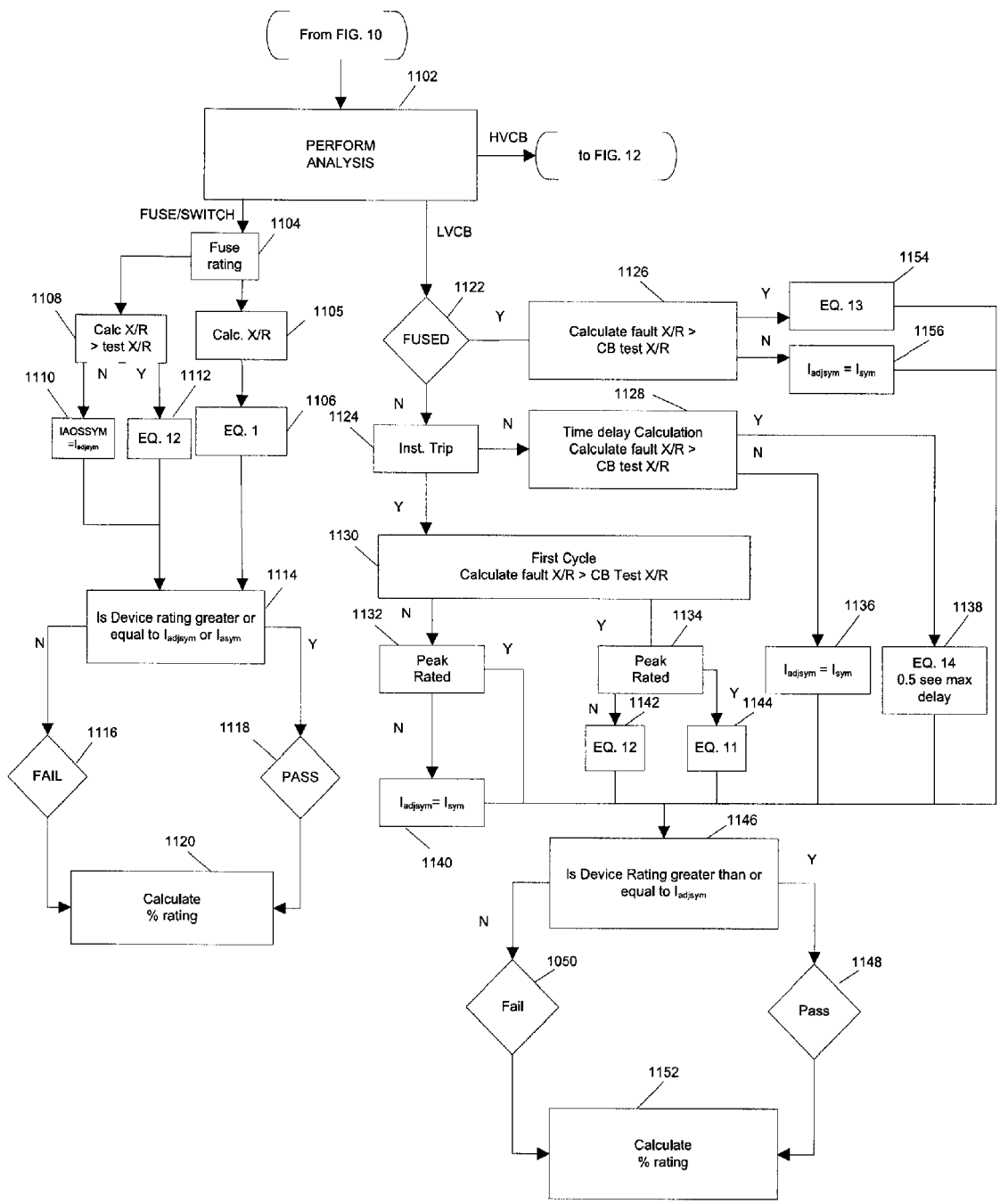
FIG. 11 is a flowchart illustrating an example process for determining the protective capabilities of the protective devices being monitored.
Figure 12:
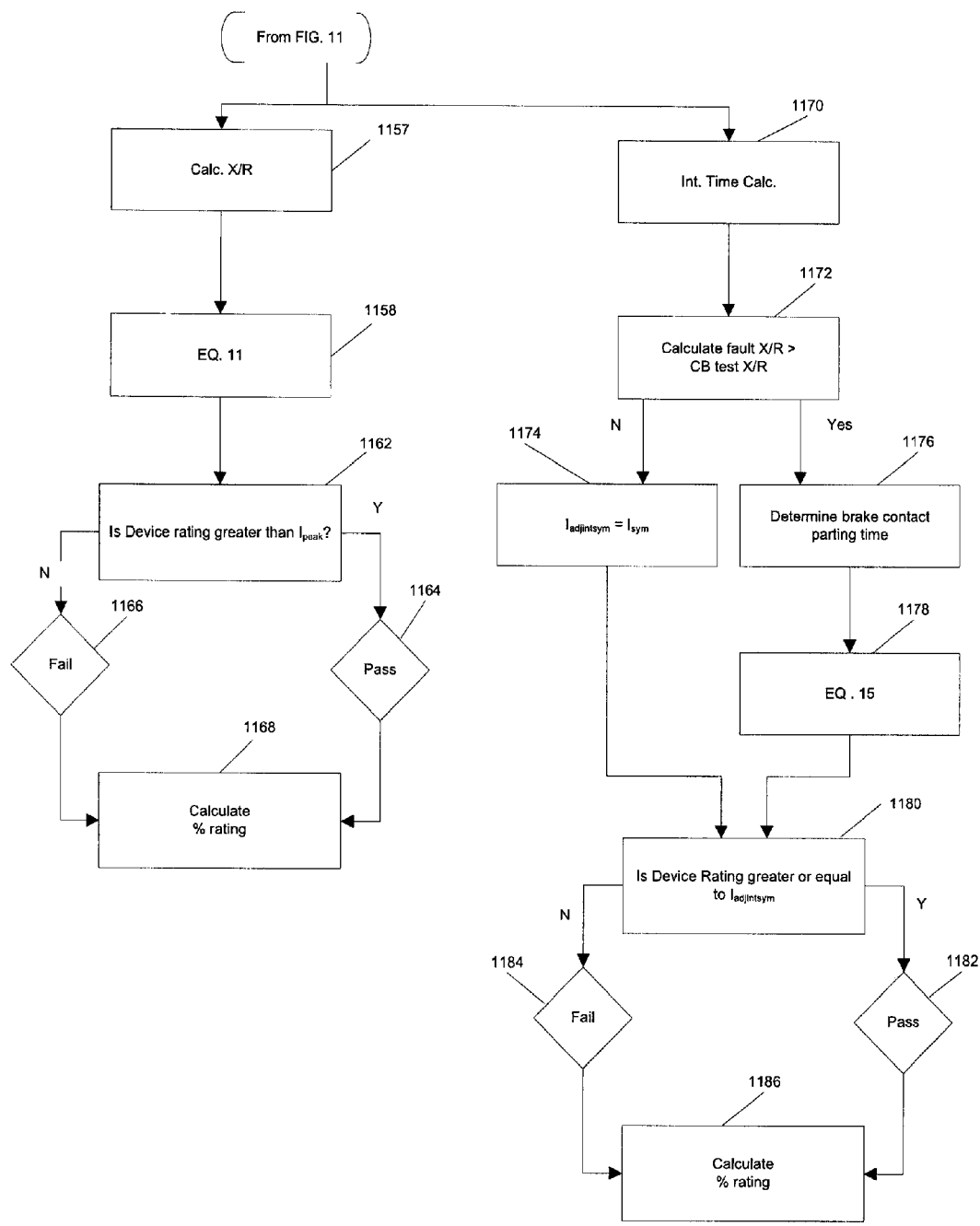
FIG. 12 is a diagram illustrating an example process for determining the protective capabilities of a High Voltage Circuit Breaker (HVCB)

FIGS. 10-12 are flow charts presenting logical flows for determining the ability of protective devices within an electrical distribution system to withstand faults and also effectively "age" the virtual system with the actual system in accordance with one embodiment. FIG. 10 is a diagram illustrating an example process for monitoring the status of protective devices in a monitored system 102 and updating a virtual model based on monitored data. First, in step 1002, the status of the protective devices can be monitored in real time.

As mentioned, protective devices can include fuses, switches, relays, and circuit breakers. Accordingly, the status of the fuses/switches, relays, and/or circuit breakers, e.g., the open/close status, source and load status, and on or off status, can be monitored in step 1002. It can be determined, in step 1004, if there is any change in the status of the monitored devices. If there is a change, then in step 1006, the virtual model can be updated to reflect the status change, i.e., the corresponding virtual components data can be updated to reflect the actual status of the various protective devices.

In step 1008, predicted values for the various components of monitored system 102 can be generated. But it should be noted that these values are based on the current, real-time status of the monitored system. In step 1010, it can be determined which predicted voltages are for a value, such as a value for a node or load, which can be calibrated. At the same time, real time sensor data can be received in step 1012. This real time data can be used to monitor the status in step 1002 and it can also be compared with the predicted values in step 1014. As noted above, the difference between the predicted values and the real time data can also be determined in step 1014.

Accordingly, meaningful predicted values based on the actual condition of monitored system 102 can be generated in steps 1004 to 1010. These predicted values can then be used to determine if further action should be taken based on the comparison of step 1014. For example, if it is determined in step 1016 that the difference between the predicted values and the real time sensor data is less than or equal to a certain threshold, e.g., DTT, then no action can be taken e.g., an instruction not to perform calibration can be issued in step 1018. Alternatively, if it is determined in step 1020 that the real time data is actually indicative of an alarm situation, e.g., is above an alarm threshold, then a do not calibrate instruction can be generated in step 1018 and an alarm can be generated as described above. If the real time sensor data is not indicative of an alarm condition, and the difference between the real time sensor data and the predicted values is greater than the threshold, as determined in step 1022, then an initiate calibration command can be generated in step 1024.

If an initiate calibration command is issued in step 1024, then a function call to calibration engine 134 can be generated in step 1026. The function call will cause calibration engine 134 to update the virtual model in step 1028 based on the real time sensor data. A comparison between the real time data and predicted data can then be generated in step 1030 and the differences between the two computed. In step 1032, a user can be prompted as to whether or not the virtual model should in fact be updated. In other embodiments, the update can be automatic, and step 1032 can be skipped. In step 1034, the virtual model could be updated. For example, the virtual model loads, buses, demand factor, and/or percent running information can be updated based on the information obtained in step 1030. An initiate simulation instruction can then be generated in step 1036, which can cause new predicted values to be generated based on the update of virtual model.

In this manner, the predicted values generated in step 1008 are not only updated to reflect the actual operational status of monitored system 102, but they are also updated to reflect natural changes in monitored system 102 such as aging. Accordingly, realistic predicted values can be generated in step 1008.

FIG. 11 is a flowchart illustrating an example process for determining the protective capabilities of the protective devices being monitored in step 1002. Depending on the embodiment, the protective devices can be evaluated in terms of the International Electrotechnical Commission (IEC) standards or in accordance with the United States or American National Standards Institute (ANSI) standards. It will be understood, that the process described in relation to FIG. 11 is not dependent on a particular standard being used.

First, in step 1102, a short circuit analysis can be performed for the protective device. Again, the protective device can be any one of a variety of protective device types. For example, the protective device can be a fuse or a switch, or some type of circuit breaker. It will be understood that there are various types of circuit breakers including Low Voltage Circuit Breakers (LVCBs), High Voltage Circuit Breakers (HVCBs), Mid Voltage Circuit Breakers (MVCBs), Miniature Circuit Breakers (MCBs), Molded Case Circuit Breakers (MCCBs), Vacuum Circuit Breakers, and Air Circuit Breakers, to name just a few. Any one of these various types of protective devices can be monitored and evaluated using the processes illustrated with respect to FIGS. 10-12.

For example, for LVCBs, or MCCBs, the short circuit current, symmetric ($I_{sym}$) or asymmetric ($I_{asym}$), and/or the peak current ($I_{peak}$) can be determined in step 1102. For, e.g., LVCBs that are not instantaneous trip circuit breakers, the short circuit current at a delayed time ($I_{symdelay}$) can be determined. For HVCBs, a first cycle short circuit current ($I_{sym}$) and/or $I_{peak}$ can be determined in step 1102. For fuses or switches, the short circuit current, symmetric or asymmetric, can be determined in step 1102. And for MVCBs the short circuit current interrupting time can be calculated. These are just some examples of the types of short circuit analysis that can be performed in Step 1102 depending on the type of protective device being analyzed.

Once the short circuit analysis is performed in step 1102, various steps can be carried out in order to determine the bracing capability of the protective device. For example, if the protective device is a fuse or switch, then the steps on the left hand side of FIG. 11 can be carried out. In this case, the fuse rating can first be determined in step 1104. In this case, the fuse rating can be the current rating for the fuse. For certain fuses, the X/R can be calculated in step 1105 and the asymmetric short circuit current ($I_{asym}$) for the fuse can be determined in step 1106 using equation 1.

$$I_{ASYM} = I_{SYM}\sqrt{1+2e^{-2p/(X/R)}} \qquad \text{Eq 1}$$

In other implementations, the inductants/reactants (X/R) ratio can be calculated in step 1108 and compared to a fuse test X/R to determine if the calculated X/R is greater than the fuse test X/R. The calculated X/R can be determined using the predicted values provided in step 1008. Various standard tests X/R values can be used for the fuse test X/R values in step 1108. For example, standard test X/R values for a LVCB can be as follows:
PCB, ICCB=6.59
MCCB, ICCB rated<=10,000 A=1.73
MCCB, ICCB rated 10,001-20,000 A=3.18
MCCB, ICCB rated>20,000 A=4.9

If the calculated X/R is greater than the fuse test X/R, then in step 1112, equation 12 can be used to calculate an adjusted symmetrical short circuit current ($I_{adjsym}$).

$$I_{ADJ\,SYM} = I_{SYM}\left\{\frac{\sqrt{1+2e^{-2p/(CALC\,X/R)}}}{\sqrt{1+2e^{-2p/(TEST\,X/R)}}}\right\} \qquad \text{Eq 12}$$

If the calculated X/R is not greater than the fuse test X/R then $I_{adjsym}$ can be set equal to $I_{sym}$ in step 1110. In step 1114, it can then be determined if the fuse rating (step 1104) is greater than or equal to $I_{adjsym}$ or $I_{asym}$. If it is, then it can determine in step 1118 that the protected device has passed and the percent rating can be calculated in step 1120 as follows:

$$\% \text{ rating} = \frac{I_{ADJ\ SYM}}{\text{Device rating}}$$

or $$\% \text{ rating} = \frac{I_{ASYM}}{\text{Device rating}}$$

If it is determined in step 1114 that the device rating is not greater than or equal to $I_{adjsym}$, then it can be determined that the device as failed in step 1116. The percent rating can still be calculating in step 1120.

For LVCBs, it can first be determined whether they are fused in step 1122. If it is determined that the LVCB is not fused, then in step 1124 can be determined if the LVCB is an instantaneous trip LVCB. If it is determined that the LVCB is an instantaneous trip LVCB, then in step 1130 the first cycle fault X/R can be calculated and compared to a circuit breaker test X/R (see example values above) to determine if the fault X/R is greater than the circuit breaker test X/R. If the fault X/R is not greater than the circuit breaker test X/R, then in step 1132 it can be determined if the LVCB is peak rated. If it is peak rated, then $I_{peak}$ can be used in step 1146 below. If it is determined that the LVCB is not peak rated in step 1132, then $I_{adjsym}$ can be set equal to $I_{sym}$ in step 1140. In step 1146, it can be determined if the device rating is greater or equal to $I_{adjsym}$, or to $I_{peak}$ as appropriate, for the LVCB.

If it is determined that the device rating is greater than or equal to $I_{adjsym}$, then it can be determined that the LVCB has passed in step 1148. The percent rating can then be determined using the equations for $I_{adjsym}$ defined above (step 1120) in step 1152. If it is determined that the device rating is not greater than or equal to $I_{adjsym}$, then it can be determined that the device has failed in step 1150. The percent rating can still be calculated instep 1152.

If the calculated fault X/R is greater than the circuit breaker test X/R as determined in step 1130, then it can be determined if the LVCB is peak rated in step 1134. If the LVCB is not peak rated, then the $I_{adjsym}$ can be determined using equation 12. If the LVCB is not peak rated, then $I_{peak}$ can be determined using equation 11.

$$I_{PEAK} = \sqrt{2} I_{SYM} \{1.02 + 0.98 e^{-3/(X/R)}\} \quad \text{Eq 11}$$

It can then be determined if the device rating is greater than or equal to $I_{adjsym}$ or $I_{peak}$ as appropriate. The pass/fail determinations can then be made in steps 1148 and 1150 respectively, and the percent rating can be calculated in step 1152.

$$\% \text{ rating} = \frac{I_{ADJ\ SYM}}{\text{Device rating}}$$

or $$\% \text{ rating} = \frac{I_{PEAK}}{\text{Device rating}}$$

If the LVCB is not an instantaneous trip LVCB as determined in step 1124, then a time delay calculation can be performed at step 1128 followed by calculation of the fault X/R and a determination of whether the fault X/R is greater than the circuit breaker test X/R. If it is not, then $I_{adjsym}$ can be set equal to $I_{sym}$ in step 1136. If the calculated fault at X/R is greater than the circuit breaker test X/R, then $I_{adjsymdelay}$ can be calculated in step 1138 using the following equation with, e.g., a 0.5 second maximum delay:

$$I_{ADJ\ SYM\ DELAY} = I_{SYM\ DELAY} \left\{ \frac{\sqrt{1 + 2e^{-60p/(CALC\ X/R)}}}{\sqrt{1 + 2e^{-60p/(TEST\ X/R)}}} \right\} \quad \text{Eq. 14}$$

It can then be determined if the device rating is greater than or equal to $I_{adjsym}$ or $I_{adjsymdelay}$. The pass/fail determinations can then be made in steps 1148 and 1150, respectively and the percent rating can be calculated in step 1152.

If it is determined that the LVCB is fused in step 1122, then the fault X/R can be calculated in step 1126 and compared to the circuit breaker test X/R in order to determine if the calculated fault X/R is greater than the circuit breaker test Xs/R. If it is greater, then $I_{adjsym}$ can be calculated in step 1154 using the following equation:

$$I_{ADJ\ SYM} = I_{SYM} \left\{ \frac{\sqrt{1.02 + 0.98 e^{-3/(CALC\ X/R)}}}{\sqrt{1.02 + 0.98 e^{-3/(TEST\ X/R)}}} \right\} \quad \text{Eq. 13}$$

If the calculated fault X/R is not greater than the circuit breaker test X/R, then $I_{adjsym}$ can be set equal to $I_{sym}$ in step 1156. It can then be determined if the device rating is greater than or equal to $I_{adjsym}$ in step 1146. The pass/fail determinations can then be carried out in steps 1148 and 1150 respectively, and the percent rating can be determined in step 1152.

FIG. 12 is a diagram illustrating an example process for determining the protective capabilities of a HVCB. In certain embodiments, the X/R can be calculated in step 1157 and a peak current ($I_{peak}$) can be determined using equation 11 in step 1158. In step 1162, it can be determined whether the HVCB's rating is greater than or equal to $I_{peak}$ as determined in step 1158. If the device rating is greater than or equal to $I_{peak}$, then the device has passed in step 1164. Otherwise, the device fails in step 1166. In either case, the percent rating can be determined in step 1168 using the following:

$$\% \text{ rating} = \frac{I_{PEAK}}{\text{Device rating}}$$

In other embodiments, an interrupting time calculation can be made in step 1170. In such embodiments, a fault X/R can be calculated and then can be determined if the fault X/R is greater than or equal to a circuit breaker test X/R in step 1172. For example, the following circuit breaker test X/R can be used;

50 Hz Test X/R=13.7

60 Hz Test X/R=16.7

(DC Time contant=0.45 Ms)

If the fault X/R is not greater than the circuit breaker test X/R then $I_{adjintsym}$ can be set equal to $I_{sym}$ in step 1174. If the calculated fault X/R is greater than the circuit breaker test X/R, then contact parting time for the circuit breaker can be determined in step 1176 and equation 15 can then be used to determine $I_{adjintsym}$ in step 1178.

$$I_{ADJ\ INT\ SYM} = I_{INT\ SYM} \left\{ \frac{\sqrt{1 + 2e^{-4pf*t/(CALC\ X/R)}}}{\sqrt{1 + 2e^{-4p*t/(TEST\ X/R)}}} \right\} \quad \text{Eq. 15}$$

In step 1180, it can be determined whether the device rating is greater than or equal to $I_{adjintsym}$. The pass/fail determinations can then be made in steps 1182 and 1184 respectively and the percent rating can be calculated in step 1186 using the following:

$$\% \text{ rating} = \frac{I_{ADJ\ INT\ SYM}}{\text{Device rating}}$$

Figure 13:
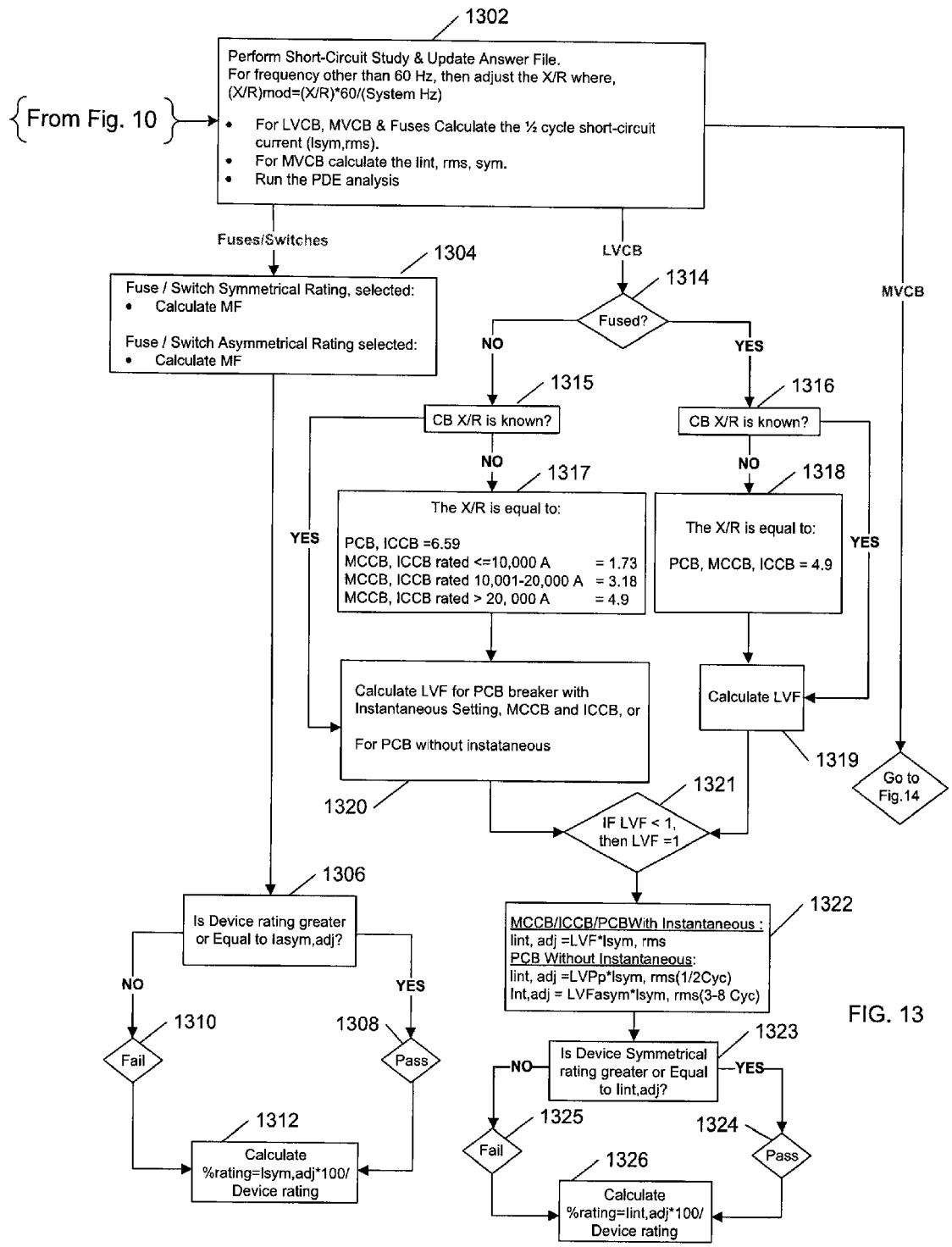
FIG. 13 is a flowchart illustrating an example process for determining the protective capabilities of the protective devices being monitored in accordance with another embodiment.

FIG. 13 is a flowchart illustrating an example process for determining the protective capabilities of the protective devices being monitored in step 1002 in accordance with another embodiment. The process can start with a short circuit analysis in step 1302. For systems operating at a frequency other than 60 hz, the protective device X/R can be modified as follows:

(X/R)mod=(X/R)*60H/(system Hz).

For fuses/switches, a selection can be made, as appropriate, between use of the symmetrical rating or asymmetrical rating for the device. The Multiplying Factor (MF) for the device can then be calculated in step 1304. The MF can then be used to determine $I_{adjasym}$ or $I_{adjsym}$. In step 1306, it can be determined if the device rating is greater than or equal to $I_{adjasym}$ or $I_{adjsym}$. Based on this determination, it can be determined whether the device passed or failed in steps 1308 and 1310 respectively, and the percent rating can be determined in step 1312 using the following:

% rating=$I_{adjasym}$*100/device rating; or

% rating=$I_{adjsym}$*100/device rating.

For LVCBs, it can first be determined whether the device is fused in step 1314. If the device is not fused, then in step 1315 it can be determined whether the X/R is known for the device. If it is known, then the LVF can be calculated for the device in step 1320. It should be noted that the LVF can vary depending on whether the LVCB is an instantaneous trip device or not. If the X/R is not known, then it can be determined in step 1317, e.g., using the following:
 The X/R is equal to:
 PCB, ICCB=6.59
 MCCB, ICCB rated<=10,000 A=1.73
 MCCB, ICCB rated 10,001-20,000 A=3.18
 MCCB, ICCB rated>20,000 A=4.9
 If the device is fused, then in step 1316 it can again be determined whether the X/R is known. If it is known, then the LVF can be calculated in step 1319. If it is not known, then the X/R can be set equal to, e.g., 4.9.
 In step 1321, it can be determined if the LVF is less than 1 and if it is, then the LVF can be set equal to 1. In step 1322 $I_{intadj}$ can be determined using the following:
 MCCB/ICCB/PCB With Instantaneous:
 Iint,adj=LVF*Isym,rms
 PCB Without Instantaneous:
 Iint,adj=LVFp*Isym,rms(½ Cyc)
 int,adj=LVFasym*Isym,rms(3-8 Cyc)
 In step 1323, it can be determined whether the device's symmetrical rating is greater than or equal to $I_{intadj}$, and it can be determined based on this evaluation whether the device passed or failed in steps 1324 and 1325 respectively. The percent rating can then be determined in step 1326 using the following:

% rating=$I_{intadj}$*100/device rating.

Figure 14:
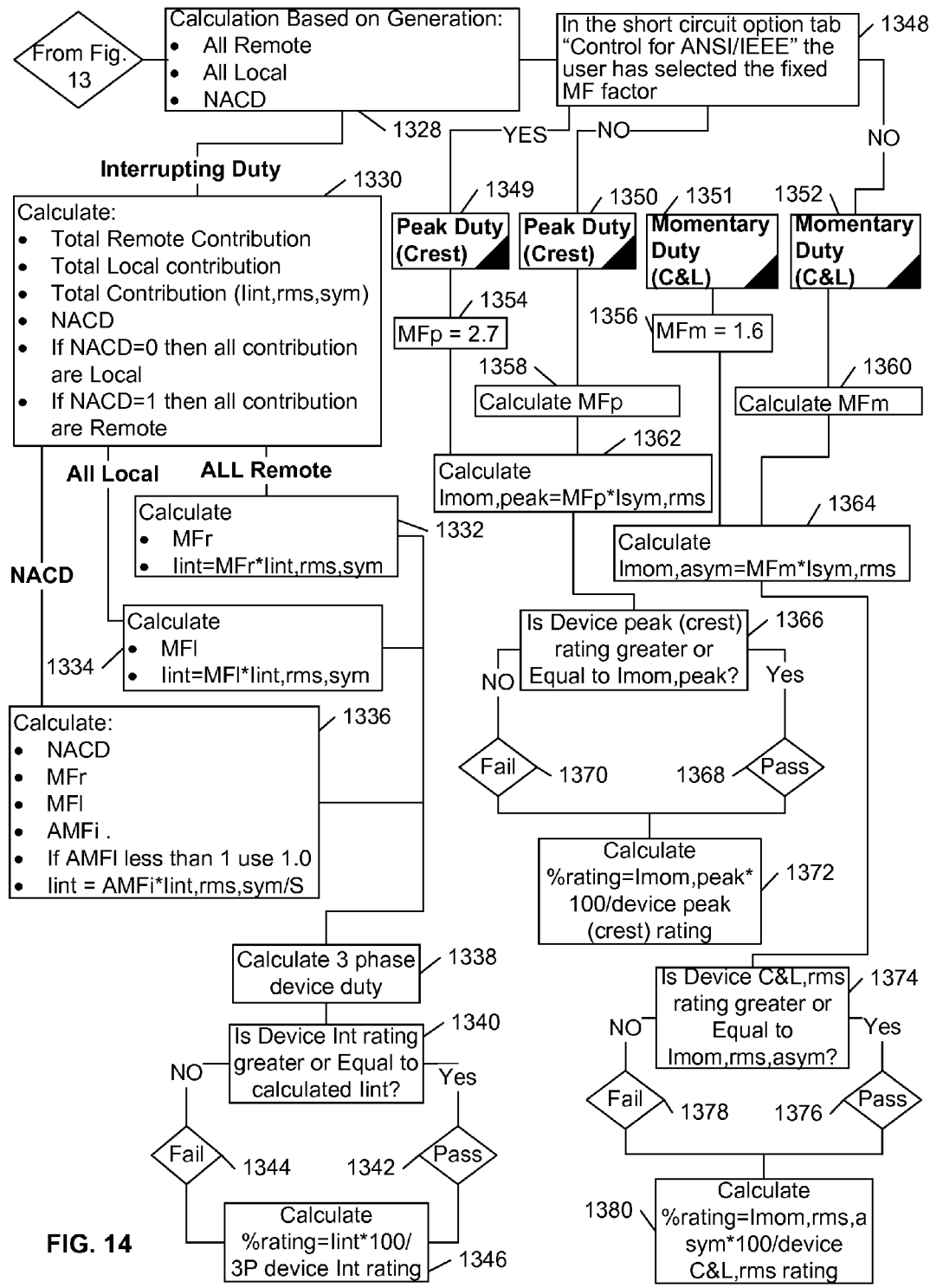
FIG. 14 is a diagram illustrating a process for evaluating the withstand capabilities of a MVCB in accordance with one embodiment.

FIG. 14 is a diagram illustrating a process for evaluating the withstand capabilities of a MVCB in accordance with one embodiment. In step 1328, a determination can be made as to whether the following calculations will be based on all remote inputs, all local inputs or on a No AC Decay (NACD) ratio. For certain implementations, a calculation can then be made of the total remote contribution, total local contribution, total contribution ($I_{intrmssym}$), and NACD. If the calculated NACD is equal to zero, then it can be determined that all contributions are local. If NACD is equal to 1, then it can be determined that all contributions are remote.

If all the contributions are remote, then in step 1332 the remote MF (MFr) can be calculated and $I_{int}$ can be calculated using the following:

$I_{int}$=MFr*$I_{intrmssym}$.

If all the inputs are local, then MFl can be calculated and $I_{int}$ can be calculated using the following:

$I_{int}$=MFl*$I_{intrmssym}$.

If the contributions are from NACD, then the NACD, MFr, MFl, and AMFl can be calculated. If AMFl is less than 1, then AMFl can be set equal to 1. $I_{int}$ can then be calculated using the following:

$I_{int}$=AMFl*$I_{intrmssym}$/S.

In step 1338, the 3-phase device duty cycle can be calculated and then it can be determined in step 1340, whether the device rating is greater than or equal to $I_{int}$. Whether the device passed or failed can then be determined in steps 1342 and 1344, respectively. The percent rating can be determined in step 1346 using the following:

% rating=$I_{int}$*100/3p device rating.

In other embodiments, it can be determined, in step 1348, whether the user has selected a fixed MF. If so, then in certain embodiments the peak duty (crest) can be determined in step 1349 and MFp can be set equal to 2.7 in step 1354. If a fixed MF has not been selected, then the peak duty (crest) can be calculated in step 1350 and MFp can be calculated in step 1358. In step 1362, the MFp can be used to calculate the following:

$I_{mompeak}$=MFp*$I_{symrms}$.

In step 1366, it can be determined if the device peak rating (crest) is greater than or equal to $I_{mompeak}$. It can then be determined whether the device passed or failed in steps 1368 and 1370 respectively, and the percent rating can be calculated as follows:

% rating=$I_{mompeak}$*100/device peak (crest) rating.

In other embodiments, if a fixed MF is selected, then a momentary duty cycle (C&L) can be determined in step 1351 and MFm can be set equal to, e.g., 1.6. If a fixed MF has not been selected, then in step 1352 MFm can be calculated. MFm can then be used to determine the following:

$I_{momsym}$=MFm*$I_{symrms}$.

It can then be determined in step 1374 whether the device C&L, rms rating is greater than or equal to $I_{momsym}$. Whether the device passed or failed can then be determined in steps 1376 and 1378 respectively, and the percent rating can be calculated as follows:

% rating=$I_{momasym}$*100/device C&L, rms rating.

Thus, the above methods provide a mean to determine the withstand capability of various protective devices, under various conditions and using various standards, using an aged, up to date virtual model of the system being monitored.

The influx of massive sensory data, e.g., provided via sensors 104, 106, and 108, intelligent filtration of this dense stream of data into manageable and easily understandable knowledge. For example, as mentioned, it is important to be able to assess the real-time ability of the power system to provide sufficient generation to satisfy the system load requirements and to move the generated energy through the system to the load points. Conventional systems do not make use of an on-line, real-time system snap shot captured by a real-time data acquisition platform to perform real time system availability evaluation.

It should also be noted that National Fire Protection Association (NFPA) and the Occupational Safety and Health Association (OSHA) have mandated that facilities comply with proper workplace safety standards and conduct Arc Flash studies in order to determine the incident energy, protection boundaries and personal protective equipment (PPE) levels required to be worn by technicians. Unfortunately, conventional approaches for performing such studies do not provide a reliable means for the real-time prediction of the potential energy released (in calories per centimeter squared) for an Arc Flash event, protection boundaries, or the PPE level required to safely perform repairs as required by NFPA 70E and Institute of Electrical and Electrics Engineers (IEEE) 1584.

When a fault in the system being monitored contains an arc, the heat released can damage equipment and cause personal injury. It is the latter concern that brought about the development of the heat exposure programs, i.e., NFPA 70E, IEEE 1584, referred to above. The power dissipated in the arc radiates to the surrounding surfaces. The further away from the arc the surface is, the less the energy is received per unit area.

As noted previously, conventional approaches are based on highly specialized static simulation models that are rigid and non-reflective of the facility's operational status at the time that a technician may be needed to conduct repairs on the electrical equipment. For example, static systems cannot adjust to the many daily changes to the electrical system that occur at a facility, e.g., motors and pumps may be on or off, on-site generation status may have changed by having diesel generators on-line, utility electrical feed may also change, etc., nor can they age with the facility. That is, the incident energy released is affected by the actual operational status of the facility and alignment of the power distribution system at the time that the repairs are performed. Therefore, a static model cannot provide the real-time analysis that can be critical for accurate safe protection boundary or PPE level determination.

Moreover, existing systems rely on exhaustive studies to be performed off-line by a power system engineer or a design professional/specialist. Often the specialist must manually modify a simulation model so that it is reflective of the proposed facility operating condition and then conduct a static simulation or a series of static simulations in order to come up with incident energy estimates for determining safe working distances and required PPE levels. Such a process is not timely, efficient, and/or accurate. Plus, the process can be quite costly.

Using the systems and methods described herein, a logical model of a facility electrical system can be integrated into a real-time environment with a robust arc flash simulation engine, a data acquisition system (data acquisition hub), and an automatic feedback system (analytics engine) that continuously synchronizes and calibrates the logical model to the actual operational conditions of the electrical system. The ability to re-align the logical model in real-time so that it mirrors the real facility operating conditions, coupled with the ability to calibrate and age the model as the real facility ages, as describe above, provides a desirable approach to predicting PPE levels, and safe working conditions at the exact time the repairs are intended to be performed. Accordingly, facility management can provide real-time compliance with NFPA 70E and IEEE 1584 standards and requirements.

Figure 15:
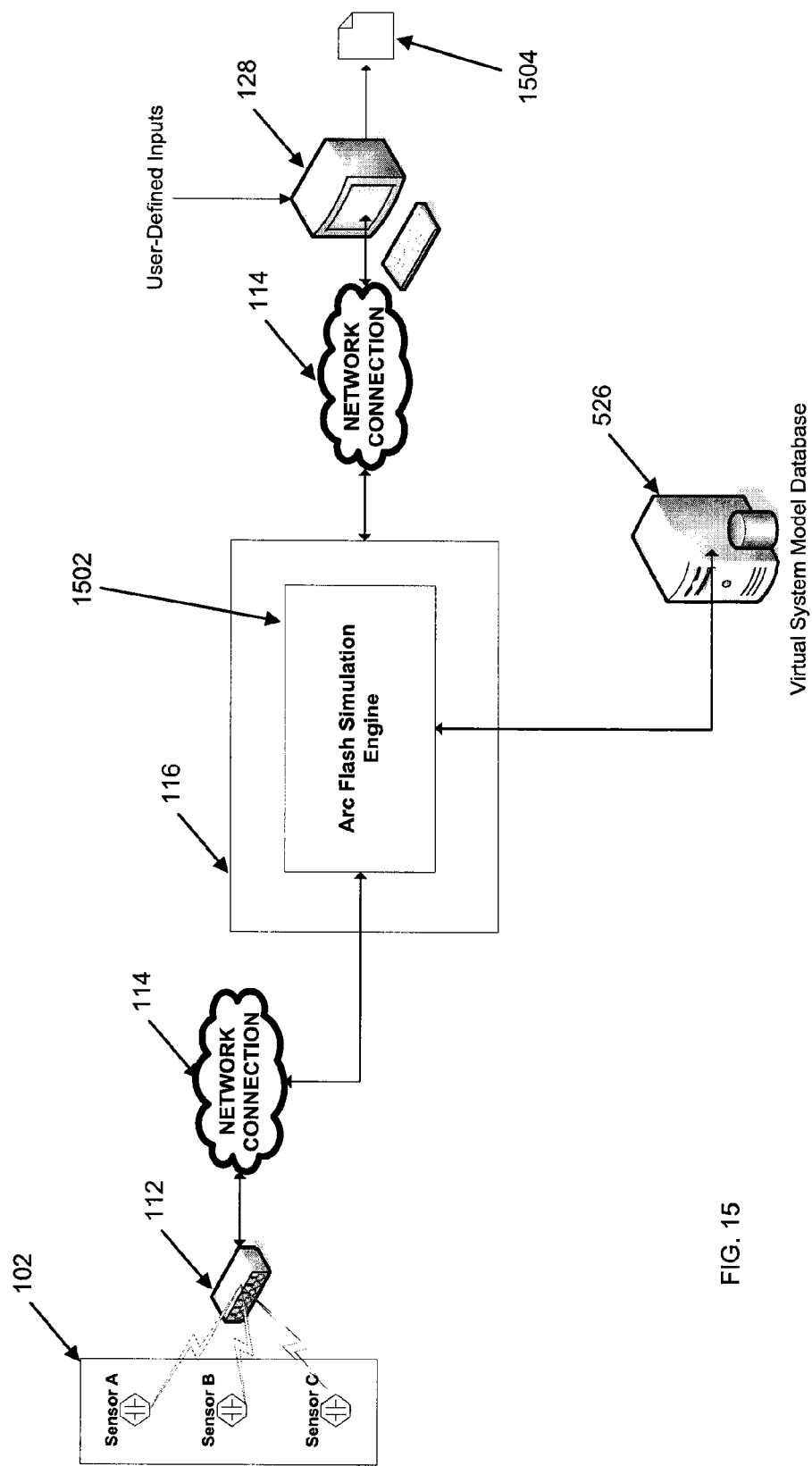
FIG. 15 is a diagram illustrating how the Arc Flash Simulation Engine works in conjunction with the other elements of the analytics system to make predictions about various aspects of an Arc Flash event on an electrical system, in accordance with one embodiment.

FIG. 15 is a diagram illustrating how an Arch Flash simulation engine works in conjunction with the other elements of the analytics system to make predictions about various aspects of an Arc Flash event on an electrical system, in accordance with one embodiment. As depicted herein, the arc flash simulation engine 1502 is housed within an analytics server 116 and communicatively connected via a network connection 114 with a data acquisition hub 112, a client terminal 128 and a virtual system model database 526. The virtual system model database 526 is configured to store a virtual system model of the electrical system 102. The virtual system model is constantly updated with real-time data from the data acquisition hub 112 to effectively account for the natural aging effects of the hardware that comprise the total electrical system 102, thus, mirroring the real operating conditions of the system.

The arc flash simulation engine 1502 can be configured to process system data from real-time data fed from the hub 112 and predicted data output from a real-time virtual system model of the electrical system 102 to make predictions about various aspects of an Arc Flash event that occurs on the electrical system 102. It should be appreciated that the arc flash simulation engine 1502 is further configured to make predictions about both alternating current (AC) and direct current (DC) Arc Flash events.

The data acquisition hub 112 is communicatively connected via data connections 110 to a plurality of sensors that are embedded throughout the electrical system 102. The data acquisition hub 112 may be a standalone unit or integrated within the analytics server 116 and can be embodied as a piece of hardware, software, or some combination thereof. In one embodiment, the data connections 110 are "hard wired" physical data connections, e.g., serial, network, etc. For example, a serial or parallel cable connection between the sensors and the hub 112. In another embodiment, the data connections 110 are wireless data connections. For example, a radio frequency (RF), BLUETOOTH™, infrared or equivalent connection between the sensor and the hub 112.

Continuing with FIG. 15, the client 128 is typically a conventional "thin-client" or "thick client" computing device that may utilize a variety of network interfaces, e.g., web browser, CITRIX™, WINDOWS TERMINAL SERVICES™, telnet, or other equivalent thin-client terminal applications, etc., to access, configure, and modify the sensors, e.g., configuration files, etc., analytics engine, e.g., configuration files, analytics logic, etc., calibration parameters, e.g., configuration files, calibration parameters, etc., Arc Flash Simulation Engine, e.g., configuration files, simulation parameters, etc., and virtual system model of the electrical system 102 under management, e.g., virtual system model operating parameters and configuration files. Correspondingly, in one embodiment, the data from the various components of the electrical system 102 and the real-time predictions (forecasts) about the various aspects of an Arc Flash event on the system can be communicated on a client 128 display panel for viewing by a system administrator or equivalent. For example, the aspects may be communicated by way of graphics, i.e., charts, icons, etc., or text displayed on the client 128 display panel. In another embodiment, the aspects can be communicated by way of synthesized speech or sounds generated by the client 128 terminal. In still another embodiment, the aspects can be summarized and communicated on a hard copy report 1502 generated by a printing device interfaced with the client 128 terminal. In yet still another embodiment, the aspects can be communicated by way of labels generated by a printing device interfaced with the client 128 terminal. It should be understood, however, that there are a myriad of different methods available to communicate the aspects to a user and that the methods listed above are provided here by way of example only.

As discussed above, the arc flash simulation engine 1502 can be configured to work in conjunction with a real-time updated virtual system model of the electrical system 102 to make predictions (forecasts) about certain aspects of an AC or DC Arc Flash event that occurs on the electrical system 102. For example, in one embodiment, the Arc Flash Simulation Engine 1502 can be used to make predictions about the incident energy released on the electrical system 102 during the Arc Flash event. Examples of protective devices include but are not limited to switches, molded case circuits (MCCs), circuit breakers, fuses, relays, etc.

In order to calculate the incident energy released during an Arc Flash event, data must be collected about the facility's electrical system 102. This data is provided by a virtual system model of the electrical system 102 stored on the virtual system model database 526 communicatively linked to the arc flash simulation engine 1502. As discussed above, the virtual system model is continuously updated with real-time data provided by a plurality of sensors interfaced to the electrical system 102 and communicatively linked to the data acquisition hub 112. In one embodiment, this data includes the arrangement of components on a one-line drawing with nameplate specifications for every device comprising the electrical system. Also included are details of the lengths and cross section area of all cables. Once the data has been collected, a short circuit analysis followed by a coordination study is performed by the Arc Flash Simulation Engine 1502 (NOTE: Since the NFPA 70E and IEEE 1584 standards do not directly apply to DC arc faults, a DC fault short circuit study is performed during simulations of DC Arc Flash events instead of the standard 3-phase fault short circuit study for AC Arc Flash events). The resultant data is then fed into the equations supplied by the NFPA 70E standard, IEEE Standard 1584, or equivalent standard. These equations will calculate the incident energy released by the Arc Flash event to, e.g., determine the necessary flash protection boundary distances and minimum PPE level requirements.

For example, in one embodiment the PPE level relates to a level required personal protective equipment (PPE) for personnel operating within the confines of the system during the Arc Flash event. For example, Table A is a NFPA 70E tabular summary of the required PPE level, i.e., PPE Category, for each given quantity of incident energy released by the Arc Flash event.

TABLE A

| Category | Cal/cm² | Clothing |
| --- | --- | --- |
| 0 | 1.2 | Untreated Cotton |
| 1 | 4 | Flame retardant (FR) shirt and FR pants |
| 2 | 8 | Cotton underwear FR shirt and FR pants |

TABLE A-continued

| Category | Cal/cm² | Clothing |
| --- | --- | --- |
| 3 | 25 | Cotton underwear FR shirt, FR pants and FR coveralls |
| 4 | 40 | Cotton underwear FR shirt, FR pants and double layer switching coat and pants |

In still another embodiment, the PPE level relates to a minimum Arc Flash protection boundary around protective devices on the electrical system 102 during an Arc Flash event. That is, the minimum distance personnel must maintain away from protective devices that are subject to Arc Flash events. These minimum protection boundaries can be communicated via printed on labels that are affixed to the protective devices as a warning for personnel working in the vicinity of the devices.

Figure 16:
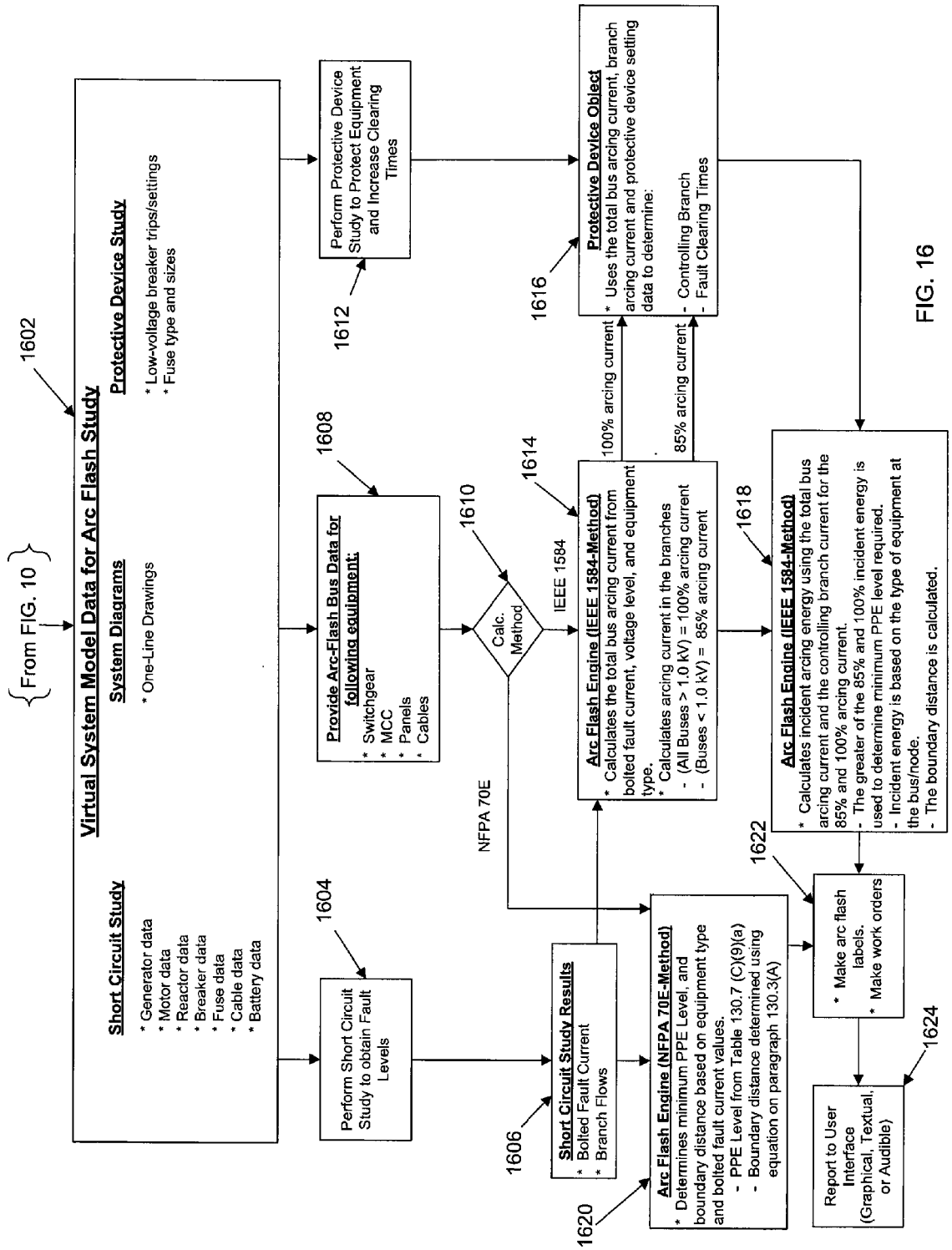
FIG. 16 is a diagram illustrating an example process for predicting, in real-time, various aspects associated with an AC or DC Arc Flash incident, in accordance with one embodiment.

FIG. 16 is a diagram illustrating an example process for predicting, in real-time, various aspects associated with an AC or DC Arc Flash incident, in accordance with one embodiment. These aspects can include for example, the Arc Flash incident energy, Arc Flash protection boundary, and required Personal Protective Equipment (PPE) levels, in compliance with NFPA-70E and IEEE-1584 standards, for personnel working in the vicinity of protective devices that are susceptible to Arc Flash events. First, in step 1602, updated virtual system model data can be obtained for the system being simulated, e.g., the updated data of step 1006, and the operating modes for the various components that comprise the system can be determined. This includes data that will later be used in system short circuit and/or protective device studies and system schematic diagrams in the form of one-line drawings. Examples of the types of data that are provided by the virtual system model for a DC analysis are summarized below in Table B. Examples of the types of data that are provided by the virtual system model for an AC analysis are summarized below in Table C. It should be appreciated that the data summarized in Tables B and C are provided herein by example only and is not intended to limit the types of data stored by and extracted from the virtual system model.

TABLE B

| Short Circuit Study Data | System Diagrams | Protective Device Study |
| --- | --- | --- |
| Generator data<br>Motor data<br>Reactor data<br>Breaker data<br>Fuse data<br>Cable data<br>Battery data | One-line drawings<br>System blueprints | Low Voltage Breaker trip settings<br>Fuse type and size |

TABLE C

| Short Circuit Study Data | System Diagrams | Protective Device Study |
| --- | --- | --- |
| Cable/Transmission line data<br>Motor data<br>Transformer data<br>Utility data<br>Generator data<br>Reactor data<br>Breaker data<br>Fuse data | One-line drawings<br>System blueprints | Low Voltage Breaker trip settings<br>Fuse type and size<br>CT Ratios<br>Relay Types/Settings |

In step 1604, a short circuit analysis, 3-phase fault for AC arc fault simulations and 1-phase fault for DC Arc Flash simulations, can be performed in order to obtain bolted fault current values for the system. The short-circuit study is based on a review of one-line drawing provided by the virtual system model of the system. Maximum available bolted fault current is calculated for each point in the system that is susceptible to an Arc Flash event. Typically, the Arc Flash vulnerable points are the protective devices that are integrated to the electrical system. In step 1606, the bolted fault current values are communicated to the Arc Flash simulation engine that is configured to make predictions about certain aspects associated with the Arc Flash events that occur on the system.

In step 1608, Arc Flash bus data for certain components, i.e., protective devices, on the electrical system are communicated to the Arc Flash simulation engine. Examples of the types of equipment data sent during this step include, but are not limited to: switchgear data, MCC data, panel data, cable data, etc. In step 1610, a standardized method, i.e., NFPA 70E, IEEE 1584, etc., is chosen for the Arc Flash simulation and incident energy calculation. For example, in one embodiment, a system administrator may configure the Arc Flash simulation engine to use either the NFPA 70E or IEEE 1584 standards to simulate the Arc Flash event and determine the quantity of incident energy released by the Arc Flash event. In another embodiment, the Arc Flash simulation engine is configured to simulate the Arc Flash event and calculate incident energy using both standards, taking the larger of the resultant incident energy numbers for use in making various predictions about aspects associated with the Arc Flash event. That is, the predicted aspects will always be based upon the most conservative estimates of the Arc Flash incident energy released.

If the IEEE 1584 method is chosen to simulate the Arc Flash event and calculate the incident energy, then the Arc Flash simulation engine performs, in step 1612, a protective device study on a specific protective device, such as a circuit breaker or fuse on the system. This study determines the operational settings of that protective device and sends that information to the Arc Flash engine for use in the subsequent Arc Flash event simulation and incident energy calculations. In step 1614, the Arc Flash engine calculates two different arcing current values, a 100% arcing current value and an 85% arcing current value, for the system using the bolted fault current value supplied by the short circuit study and the system voltage value supplied by the virtual system model simulation. This is to account for fluctuations in system voltage values that normally occur during the day to day operation of the electrical system. To account for the fluctuations two arcing current and incident energy calculations are made; one using the calculated expected arc current, i.e., 100% arcing current, and one using a reduced arc current that is 15% lower, i.e., 85% arcing current, to account for when the system operates at less than 1 kilovolts (kV). In step 1616, the fault clearing times in the protective device can be determined using the arcing currents values and protective device settings determined in steps 1612 and 1614.

In step 1618, the IEEE 1584 equations can be applied to the fault clearing time (determined in step 1616) and the arcing current values, both the 100% and 85% arcing current values, to predict the incident energy released by an Arc Flash event occurring on the protective device during a 100% arc current scenario, i.e., expected arc current level, and an 85% arc current scenario, i.e., reduced arc current level. The 100% and 85% arcing current incident energy values are then compared against each other with the higher of the two being selected for use in determining certain aspects associated with the Arc Flash event. For example, in one embodiment, the aspect relates to the required PPE levels for personnel. In another embodiment, the aspect relates to the Arc Flash protection boundary around the protective device.

If the NFPA 70E method is chosen to simulate the Arc Flash event, the Arc Flash simulation engine proceeds directly to step 1620 where the incident arcing energy level is calculated by applying the bolted current values determined in step 1604, the fault clearing time determined in step 1616, and the system voltage values to equations supplied by NFPA 70E standard. The calculated incident arc energy level value is then used by the Arc Flash simulation engine to make predictions about certain aspects of the Arc Flash event. For example, in one embodiment, the incident arc energy level is referenced against Table 130.7(C)(9)(a) of NFPA 70E to predict the required PPE levels for personnel operating around the protective device experiencing the Arc Flash event being simulated. In another embodiment, the safe working boundary distance is determined using the equation supplied by paragraph 130.3(A) of the NFPA.

It should be noted that the NFPA 70E steps may only apply to AC calculations. As noted above, there are no equations/standards for DC calculations. Accordingly, in certain embodiments, DC determinations are made using the IEEE 1584 equations and substituting the single phase shot circuit analysis in step 1604. In certain embodiments, a similar substitution can be made for NFPA 70E DC determinations.

In step 1622, Arc Flash labels and repair work orders based upon the above discussed predictions may be generated by the Arc Flash simulation engine. That is appropriate protective measures, clothing and procedures can be mobilized to minimize the potential for injury should an Arc Flash incident occur. Thus allowing facility owners and operators to efficiently implement a real-time safety management system that is in compliance with NFPA 70E and IEEE 1584 guidelines.

In step 1624, the aspects are communicated to the user. In one embodiment, the aspects are communicated by way of graphics, i.e., charts, icons, etc., or text displayed on a client display panel. In another embodiment, the aspects are communicated by way of synthesized speech or sound generated by the client terminal. In still another embodiment, the aspects are summarized and communicated on a hard copy report generated by a printing device interfaced with the client terminal. In yet still another embodiment, the aspects are communicated by way of labels generated by a printing device interfaced with the client terminal. It should be understood, however, that there are a myriad of different methods available to communicate the aspects to a user and that the methods listed above are provided here by way of example only.

Using the same or a similar procedure as illustrated in FIG. 16, the following AC evaluations can be made in real-time and based on an accurate, e.g., aged, model of the system:

Arc Flash Exposure based on IEEE 1584;
    Arc Flash Exposure based on NFPA 70E;
    Network-Based Arc Flash Exposure on AC Systems/Single Branch Case;
    Network-Based Arc Flash Exposure on AC Systems/Multiple Branch Cases;
    Network Arc Flash Exposure on DC Networks;
    Exposure Simulation at Switchgear Box, MCC Box, Open Area and Cable Grounded and Ungrounded;
    Calculate and Select Controlling Branch(s) for Simulation of Arc Flash;
    Test Selected Clothing;
    Calculate Clothing Required;
    Calculate Safe Zone with Regard to User Defined Clothing Category;
    Simulated Art Heat Exposure at User Selected locations;

User Defined Fault Cycle for 3-Phase and Controlling Branches;
User Defined Distance for Subject;
100% and 85% Arcing Current;
100% and 85% Protective Device Time;
Protective Device Setting Impact on Arc Exposure Energy;
User Defined Label Sizes;
Attach Labels to One-Line Diagram for User Review;
Plot Energy for Each Bus;
Write Results into Excel;
View and Print Graphic Label for User Selected Bus(s); and
Required work permits.

Using the same or a similar procedure as illustrated in FIG. 16, the following DC evaluations can be made in real-time and based on an accurate, e.g., aged, model of the system:

DC Arc Flash Exposure
Network-Based Arc Flash Exposure on DC Systems/Single Branch Case
Network-Based Arc Flash Exposure on DC Systems/Multiple Branch Cases
Exposure Simulation at Switchgear Box, MCC Box, Open Area and Cable Grounded and Ungrounded
Calculate and Select Controlling Branch(s) for Simulation of DC Arc Flash
Test Selected Clothing
Calculate Clothing Required
Calculate Safe Zone with Regard to User Defined Clothing Category
Simulated DC Art Heat Exposure at User Selected locations
User Defined Fault Cycle for DC and Controlling Branches
User Defined Distance for Subject
100% and 85% Arcing Current
100% and 85% Protective Device Time
Protective Device Setting Impact on DC Arc Exposure Energy
User Defined Label Sizes
Attach Labels to Equipment/Interface/Diagram for User Review
Plot Energy for Each Bus
Write Results into Excel
View and Print Graphic Label for User Selected Bus(s)
Required work permit As noted, Arc Flash is the analysis of the potentially life threatening explosive discharge of energy in a radiated arc away from the source. Often, determination of the highest potential arcing energy should be based on the actual values in the past thirty days. Conventional standards and practices do not guarantee that highest energy will be detected; because all the possible scenarios are not, or could not be, evaluated or because the on-line changes in the system make the previous analysis obsolete.

No reliable means exists for the real time determination of the potential for Arc Flash energy that is consistent with the standards established in both NFPA-70E, IEEE-1584 procedures for accurately predicting the potential for Arc Flash by automatically including the existing potential energy based on the highest and lowest short circuit current in the previous 30 days. Conventional calculation of Arc Flash energy and corresponding PPE as defined in both NFPA-70E, IEEE-1584 is based on calculation of both the arcing current and tripping time. In general, higher arcing current corresponds to higher energy; however, due to the nonlinear relationship between the arcing current and tripping time, it is possible that low arcing current can cause high tripping time and yield the higher Arc Flash energy. Therefore, conventional Arc Flash determinations are performed off-line and are based on the evaluation of several scenarios and calculation of the highest and lowest short-circuit, and arcing current, and then selecting the scenario that yields the highest Arcing Energy. The shortcomings of such conventional processes are the required subjective choice of scenarios by the engineer performing the analysis. Also, in the case of high-order systems it is not feasible to access all the scenarios.

Figure 17:
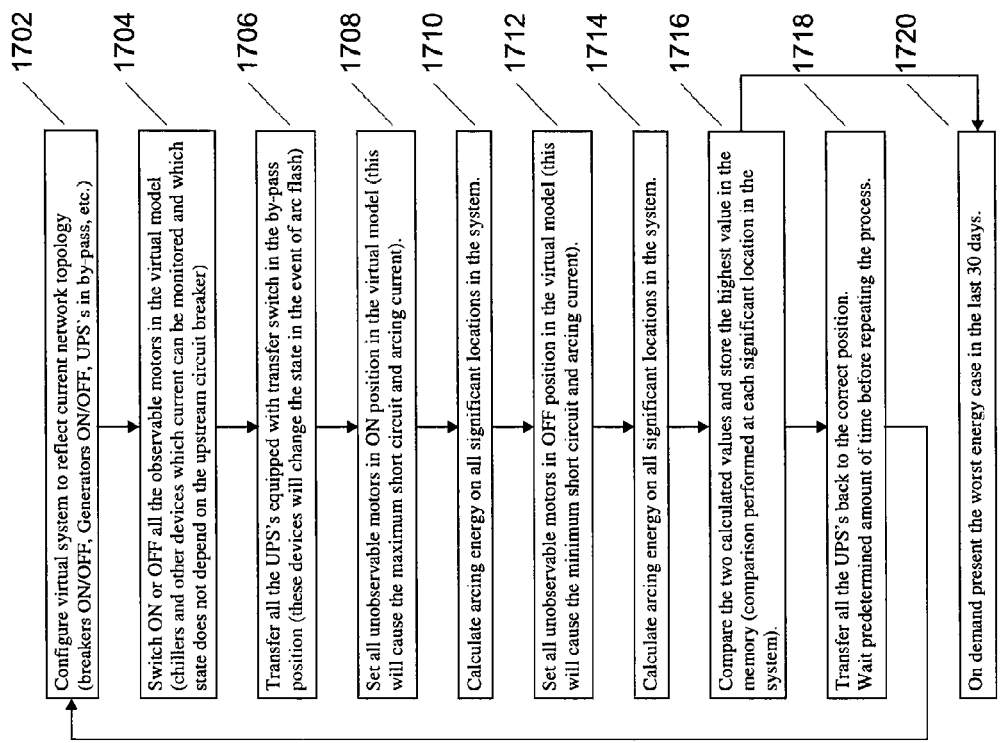
FIG. 17 is a flow chart illustrating an example process for an example process for predicting, in real-time, various aspects associated with an AC or DC Arc Flash incident using a virtual no load scenario as a second critical input, in accordance with one embodiment.

FIG. 17 is a flow chart illustrating an example process for an example process for predicting, in real-time, various aspects associated with an AC or DC Arc Flash incident using a virtual no load scenario as a second critical input, in accordance with one embodiment. In the process illustrated in FIG. 17, the results are accurate and truly reflect the correct potential energy. Consequently, such a process automatically presents the worst case scenario produced in a real time. Further, the system operator is provided the ability to perform the same balanced analysis based on hypothetical conditions to determine the probable results and impact prior to making any physical change to the environment providing "what if" planning.

The process of FIG. 17 builds on the data acquired and analyzed in real-time as described above. A virtual no load scenario is then generated as the second critical input into the analysis for determining true Arc Flash or Arc Heat potential, providing a real-time analysis that complies with NFPA-70E and IEEE-1584. Thus, process illustrated in FIG. 17 provides an automated method for determining the greatest potential Arc Flash energy based on empirical measured values and does not rely on the subjective analysis or incorrect assumptions of typical static or off line systems First, in step 1702, the virtual system model is updated to reflect current network topology, e.g., breakers ON/OFF, Generators ON/OFF, UPS's in by-pass, etc., as indicated by the real-time data. In step 1702, all the observable motors in the virtual model, e.g., chillers and other devices for which current can be monitored and for which state does not depend on the upstream circuit breaker, can be switched ON or OFF. In step 1706, all the UPS's equipped with a transfer switch in the by-pass position are transferred. These devices will change state in the event of arc flash. In step 1708, all unobservable motors are set to the ON position in the virtual model. This will cause the maximum short circuit and arcing current.

In step 1710, the arcing energy for all significant locations in the system are then calculated. In step 1712, all unobservable motors are then switched to the OFF position in the virtual model. This will cause the minimum short circuit and arcing current. The arcing energy for all significant locations in the system is then calculated again in step 1714. In step 1716, the two calculated values of steps 1710 and 1714 are compared and the highest value for each significant location in the system can be stored.

In step 1718, all the UPS's can be transferred back to the correct position and the process can be repeated after a predetermined delay. The delay can be set based on the requirements of a particular implementation.

Now, in step 1720, the worst case Arc Flash for the last 30 days can be accessed on demand. In one embodiment, the worst case Arc Flash can be communicated by way of graphics, i.e., charts, icons, etc, or text displayed on a client display panel. In another embodiment, the worst case Arc Flash can be communicated by way of synthesized speech or sound generated by the client terminal. In still another embodiment, the worst case Arc Flash can be summarized and communicated on a hard copy report generated by a printing device interfaced with the client terminal. In yet still another embodiment, the worst case Arc Flash can be communicated by way of labels generated by a printing device interfaced with the client terminal. It should be understood, however, that there are a myriad of different methods available to communicate the aspects to a user and that the methods listed above are provided here by way of example only.

The embodiments described herein, can be practiced with other computer system configurations including hand-held devices, microprocessor systems, microprocessor-based or programmable consumer electronics, minicomputers, mainframe computers and the like. The embodiments can also be practiced in distributing computing environments where tasks are performed by remote processing devices that are linked through a network.

It should also be understood that the embodiments described herein can employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations that form part of the embodiments described herein are useful machine operations. The invention also relates to a device or an apparatus for performing these operations. The systems and methods described herein can be specially constructed for the required purposes, such as the carrier network discussed above, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The embodiments described herein can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Certain embodiments can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed:

1. A system for making real-time predictions about an arc flash event on an electrical system, the system comprising:
   a data acquisition component communicatively connected to a sensor configured to acquire real-time data output from the electrical system; and
   an analytics server communicatively connected to the data acquisition component, the analytics server comprising
      a virtual system modeling engine configured to generate predicted data output for the electrical system using a virtual system model of the electrical system,
      an analytics engine configured to monitor the real-time data output and the predicted data output of the electrical system, and
      an arc flash simulation engine configured to use the virtual system model updated based in the real-time data to forecast an aspect of the arc flash event;
   wherein the analytics server is configured to perform steps comprising
      updating the virtual system model based on the real-time data output,
      switching all observable models in the virtual system model to an ON position or OFF position,
      transferring all uninterrupted power supplies (UPS) equipped with a transfer switch in the virtual system model that is in the by-pass mode,
      setting all unobservable motors in the virtual system model to the ON position in the virtual model,
      calculating arcing energy for all significant locations in the virtual system model,
      setting all unobservable motors in the virtual system model to the OFF position,
      calculating arcing energy for all significant locations in the virtual system model,
      comparing the two calculations for each significant location, and
      storing the highest calculated arcing energy for each significant location.

2. The system for making real-time predictions about an arc flash event on an electrical system, as recited in claim 1, further comprising a client terminal communicatively connected to the analytics server and configured to communicate the forecasted aspect.

3. The system for making real-time predictions about an arc flash event on an electrical system, as recited in claim 2, wherein the forecasted aspect is communicated by way of graphics on a display interfaced with the client terminal.

4. The system for making real-time predictions about an arc flash event on an electrical system, as recited in claim 2, wherein the forecasted aspect is communicated by way of text on a display interfaced with the client terminal.

5. The system for making real-time predictions about an arc flash event on an electrical system, as recited in claim 2, wherein the forecasted aspect is communicated by way of synthesized speech generated by the client terminal.

6. The system for making real-time predictions about an arc flash event on an electrical system, as recited in claim 2, wherein the forecasted aspect is communicated by way of a paper report generated by a printing device interfaced with the client terminal.

7. The system for making real-time predictions about an arc flash event on an electrical system, as recited in claim 1, wherein the analytics engine is further configured to initiate a calibration and synchronization operation to update the virtual system model when a difference between the real-time data output and the predicted data output exceeds a threshold.

8. The system for making real-time predictions about an arc flash event on an electrical system, as recited in claim 1, wherein the arc flash event is a direct current (DC) arc flash event.

9. The system for making real-time predictions about an arc flash event on an electrical system, as recited in claim 1, wherein the arc flash event is an alternating current (AC) arc flash event.

10. The system for making real-time predictions about an arc flash event on an electrical system, as recited in claim 1, wherein the arc flash simulation engine applies Institute of Electrical and Electronics Engineers (IEEE) 1584 standards to forecast the aspect.

11. The system for making real-time predictions about an arc flash event on an electrical system, as recited in claim 1, wherein the arc flash simulation engine applies National Fire Protection Association (NFPA) 70E standards to forecast the aspect.

12. The system for making real-time predictions about an arc flash event on an electrical system, as recited in claim 1, wherein the forecasted aspect is a worst case arc flash event for a component within the electrical system over a specified time period.

13. The system for making real-time predictions about an arc flash event on an electrical system, as recited in claim 12, wherein the component is a protective device.

14. The system for making real-time predictions about an arc flash event on an electrical system, as recited in claim 13, wherein the protective device is a switch.

15. The system for making real-time predictions about an arc flash event on an electrical system, as recited in claim 13, wherein the protective device is a circuit breaker.

16. The system for making real-time predictions about an arc flash event on an electrical system, as recited in claim 13, wherein the protective device is a fuse.

17. The system for making real-time predictions about an arc flash event on an electrical system, as recited in claim 13, wherein the protective device is a relay.

18. The system for making real-time predictions about an arc flash event on an electrical system, as recited in claim 1, wherein the analytics server is further configured to transfer all the UPS' s in the virtual system model back to the correct position, wait a predetermined delay time, and repeat the steps.

19. The system for making real-time predictions about an arc flash event on an electrical system, as recited in claim 1, wherein the analytics server is further configured to present the worst case arcing energy for any of the significant locations over the last 30 days when requested.

* * * * *